(12) United States Patent
Shimada et al.

(10) Patent No.: US 6,725,417 B2
(45) Date of Patent: Apr. 20, 2004

(54) SEQUENTIAL DECODING APPARATUS AND METHOD

(75) Inventors: Michio Shimada, Kanagawa (JP); Hisashi Suzuki, Tokyo (JP)

(73) Assignee: Machine Learning Laboratory, Inc., Kanagawa (JP)

( * ) Notice: Subject to any disclaimer, the term of this patent is extended or adjusted under 35 U.S.C. 154(b) by 449 days.

(21) Appl. No.: 09/803,949

(22) Filed: Mar. 13, 2001

(65) Prior Publication Data

US 2001/0025362 A1 Sep. 27, 2001

(30) Foreign Application Priority Data

Mar. 14, 2000 (JP) ........................................ 2000-069785

(51) Int. Cl.[7] .............................................. H03M 13/00
(52) U.S. Cl. ...................................................... 714/791
(58) Field of Search ................................ 714/791, 794, 714/795, 796; 375/262, 265

(56) References Cited

U.S. PATENT DOCUMENTS 3,665,396 A    5/1972   Forney, Jr. ................... 714/800
5,014,275 A  * 5/1991   Shimoda et al. ............. 714/791

FOREIGN PATENT DOCUMENTS

WO    WO 02/33827 A2 *  4/2002

OTHER PUBLICATIONS

R. Fano, "A Heuristic Discussion of Probabilistic Decoding", IEEE Transactions Information Theory, vol. IT–9, (Apr. 1963), pp. 64–74.

R.G. Gallager, "Information Theory and Reliable Communication", Techniques for Coding and Decoding, (1968), pp. 262–287.

S.W. Golomb et al., "Backtrack Programming", Journal of the Association for Computing Machinery, vol. 12, No. 4, (Oct. 1965), pp. 516–524 with Abstract.

F.M. Carrano, "Data Abstraction and Problem Solving with C++ Walls and Mirrors", Trees, pp. 436–511.

* cited by examiner

*Primary Examiner*—Albert Decady
*Assistant Examiner*—Shelly A Chase
(74) *Attorney, Agent, or Firm*—Sughrue Mion, PLLC

(57) ABSTRACT

Sequentially decoding a plurality of symbol sets of an incoming data sequence with less amount of computation in an application wherein paths in a code tree do not occur equiprobably is disclosed. A code tree is previously memorized which comprises a plurality of paths defined by a plurality of sequences of nodes. A pointer generator is provided for generating a pointer that defines a node that specifies a path in the code tree. A plurality of branch metric generators each generates a metric of a branch which forms part of a path and which is to be examined with a corresponding symbol set of the incoming data sequence. Further, a plurality of path metric generators are provided which respectively receive the branch metrics from the plurality of branch metric generators and respectively generate path metrics using the branch metrics. A controller controls the pointer generator and the plurality of path metric generators such as to maximize each of the plurality of path metrics at each of decoding steps in order to sequentially decode the symbol sets of said incoming data sequence.

12 Claims, 19 Drawing Sheets

FIG. 5 (PRIOR ART)

| RULE | CONDITIONS ON NODE | | ACTION TO BE TAKEN | |
|---|---|---|---|---|
| | PREVIOUS MOVE | COMPARISON OF METRIC WITH THRESHOLD | THRESHOLD | MOVE |
| 1 | F or L | $\Gamma(\underline{X}_{j-1}) < T+\Delta$ and $\Gamma(\underline{X}_j) \geq T$ | INCREMENT (I) | F |
| 2 | F or L | $\Gamma(\underline{X}_{j-1}) \geq T+\Delta$ and $\Gamma(\underline{X}_j) \geq T$ | NO CHANGE (N) | F |
| 3 | F or L | $\Gamma(\underline{X}_j) < T$ | NO CHANGE (N) | L or B |
| 4 | B | $\Gamma(\underline{X}_{j-1}) < T$ | DECREMENT (D) | F |
| 5 | B | $\Gamma(\underline{X}_{j-1}) \geq T$ | NO CHANGE (N) | L or B |

Note 1: "INCREMENT (I)" implies adding $t\Delta$ to threshold where t is chosen to be maximum integer satisfying $\Gamma(\underline{X}_j) - \Delta < T+t\Delta \leq \Gamma(\underline{X}_j)$ Note 2: "DECREMENT (D)" implies decreasing T by $\Delta$ (T=T−$\Delta$)

Note 3: "L OR B" implies lateral move of pointer (if possible) or backward move of pointer (otherwise)

Note 4: as to undefined $\Gamma(\underline{X}_0)$ and $\Gamma(\underline{X}_{-1})$, assuming $\Gamma(\underline{X}_0) = 0$ and $\Gamma(\underline{X}_{-1}) = -\infty$

FIG. 6

| RULE | CONDITIONS ON NODE | | ACTION TO BE TAKEN | |
|---|---|---|---|---|
| | PREVIOUS MOVE | COMPARISON OF METRIC WITH THRESHOLD | THRESHOLD | MOVE |
| 1.1 | F or L | $\Gamma_1(\underline{X}_{j-1}) < T_1+\Delta_1$ and $\Gamma_1(\underline{X}_j) \geq T_1$ and $\Gamma_2(\underline{X}_j) \geq T_2$ | INCREMENT OF $T_1$ (I) | F |
| 1.2 | F or L | $\Gamma_1(\underline{X}_j) \geq T_1$ and $\Gamma_2(\underline{X}_{j-1}) < T_2+\Delta_2$ and $\Gamma_2(\underline{X}_j) \geq T_2$ | INCREMENT OF $T_2$ (I) | F |
| 2 | F or L | $\Gamma_1(\underline{X}_{j-1}) \geq T_1+\Delta_1$ and $\Gamma_1(\underline{X}_j) \geq T_1$ and $\Gamma_2(\underline{X}_{j-1}) \geq T_2+\Delta_2$ and $\Gamma_2(\underline{X}_j) \geq T_2$ | NO CHANGE (N) | F |
| 3 | F or L | $\Gamma_1(\underline{X}_j) < T_1$ or $\Gamma_2(\underline{X}_j) < T_2$ | NO CHANGE (N) | L or B |
| 4.1 | B | $\Gamma_1(\underline{X}_{j-1}) < T_1$ | DECREMENT OF $T_1$ (D) | F |
| 4.2 | B | $\Gamma_2(\underline{X}_{j-1}) < T_2$ | DECREMENT OF $T_2$ (D) | F |
| 5 | B | $\Gamma_1(\underline{X}_{j-1}) \geq T_1$ and $\Gamma_2(\underline{X}_{j-1}) \geq T_2$ | NO CHANGE (N) | L or B |

Note 1: "INCREMENT OF $T_k$ (I)" implies adding $t \Delta_k$ to threshold where t is chosen to be maximum integer satisfying $\Gamma_k(\underline{X}_j) - \Delta < T_k + t \Delta_k < \Gamma_k(\underline{X}_j)$ Note 2: "DECREMENT OF $T_k$ (D)" implies decreasing $T_k$ by $\Delta_k$ ($T_k = T_k - \Delta_k$)

Note 3: "L OR B" implies lateral move of pointer (if possible) or backward move of pointer (otherwise)

Note 4: as to undefined $\Gamma_k(\underline{X}_0)$ and $\Gamma_k(\underline{X}_{-1})$, assuming $\Gamma_k(\underline{X}_0) = 0$ and $\Gamma_k(\underline{X}_{-1}) = -\infty$ Note 5: k = 1, 2

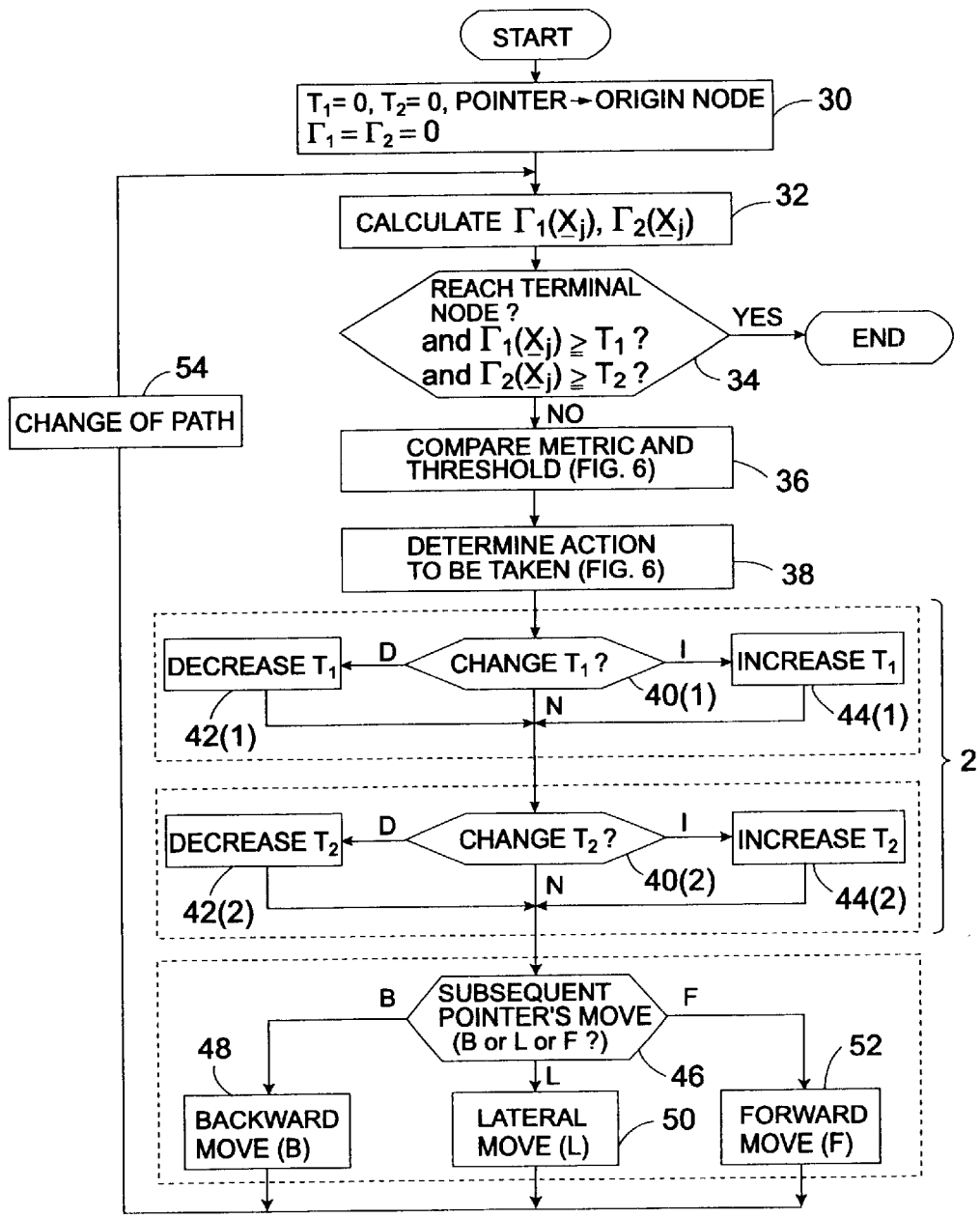

FIG. 15

| RULE | PREVIOUS MOVE | CONDITIONS ON NODE — COMPARISON OF METRIC WITH THRESHOLD | ACTION TO BE TAKEN — THRESHOLD | MOVE |
|---|---|---|---|---|
| 1.1 | F or L | $\Gamma_1(\underline{X}_{j-1}) < T_1+\Delta_1$ and $\Gamma_1(\underline{X}_j) > T_1$ and $\Gamma_2(\underline{X}_j) \geq T_2$ and $\vdots$ $\Gamma_m(\underline{X}_j) \geq T_m$ | INCREMENT OF $T_1$ (I) | F |
| $\vdots$ | $\vdots$ | $\vdots$ | $\vdots$ | $\vdots$ |
| 1.m | F or L | $\Gamma_1(\underline{X}_j) \geq T_1$ and $\vdots$ $\Gamma_{m-1}(\underline{X}_j) \geq T_{m-1}$ and $\Gamma_m(\underline{X}_{j-1}) < T_m+\Delta_m$ and $\Gamma_m(\underline{X}_j) \geq T_m$ | INCREMENT OF $T_m$ (I) | F |
| 2 | F or L | $\Gamma_1(\underline{X}_{j-1}) \geq T_1+\Delta_1$ and $\Gamma_1(\underline{X}_j) \geq T_1$ and $\vdots$ $\Gamma_m(\underline{X}_{j-1}) \geq T_m+\Delta_m$ and $\Gamma_m(\underline{X}_j) \geq T_m$ | NO CHANGE (N) | F |
| 3 | F or L | $\Gamma_1(\underline{X}_j) < T_1$ $\vdots$ or $\Gamma_m(\underline{X}_j) < T_m$ | NO CHANGE (N) | L or B |
| 4.1 | B | $\Gamma_1(\underline{X}_{j-1}) < T_1$ | DECREMENT OF $T_1$ (D) | F |
| $\vdots$ | $\vdots$ | $\vdots$ | $\vdots$ | $\vdots$ |
| 4.m | B | $\Gamma_m(\underline{X}_{j-1}) < T_m$ | DECREMENT OF $T_m$ (D) | F |
| 5 | B | $\Gamma_1(\underline{X}_{j-1}) \geq T_1$ and $\vdots$ $\Gamma_m(\underline{X}_{j-1}) \geq T_m$ | NO CHANGE (N) | L or B |

FIG. 19

FUNCTION TABLE OF OPERATION DETERMINER 86 OF FIG.17

US 6,725,417 B2

SEQUENTIAL DECODING APPARATUS AND METHOD

BACKGROUND OF THE INVENTION

1. Field of the Invention

The present invention relates generally to sequential decoding, and more specifically to techniques for sequentially decoding an incoming (received) data sequence in an attempt to find the most likely path in a code tree.

2. Description of Related Art

Prior to turning to the present invention, it is deemed preferable to describe, with reference to FIGS. 1–5, sequential decoding technology known as the Fano algorithm.

Reference is made to FIG. 1, a simple example of an encoder 10, which takes the form of a binary convolutional encoder, is illustrated in block diagram form. The encoder 10 is comprised of a shift-register consisting of three flip-flops 12a–12c and two exclusive-or gates 14a–14b, all of which are coupled as shown. In order to initialize the flip-flops 12a–12c, a control signal, which takes a logic level 0 (for example), is applied to the flip-flops 12a–12c by way of an input terminal 16c. Each of the flop-flops 12a–12c, in response to logic level 0 of the control signal, is cleared to zero. After the initialization of the flip-flops 12a–12c, the control signal continues to assume a logic level 1. When a plurality of information symbols are successively applied to the flip-flop 12a via an input terminal 16b while the control signal takes a logic level 1, they are shifted one by one to the subsequent flop-flops 12b and 12c in synchronism with a clock signal applied to the flip-flops 12a–12c by way of an input terminal 16a. In the above, each of the information symbols applied to the encoder 10 via the input terminal 16b is binary, and therefore, to be precise, has to be referred to as an information bit. However, in the instant disclosure, for the sake of convenience of description, the information bit may typically be referred to as information symbol.

The exclusive-or gate 14a has four inputs respectively coupled to receive directly the information symbol by way of the input terminal 16b and the outputs of the flip-flops 12a–12c, and then applies the output thereof to an output terminal 18b. The other exclusive-or gate 14b has three inputs for respectively directly receiving the information symbols via the input terminal 16b and the outputs flip-flops 12b and 12c, and applies the output thereof to an output terminal 18c. On the other hand, the incoming information symbol is directly fed to an output terminal 18a.

Assuming that information symbols $u_1, u_2, u_3, \ldots$ are sequentially applied to the encoder 10 through the input terminal 16b. The initial information symbol $u_1$ determines first three encoded data sequence $x_1^{(1)}, x_1^{(2)}, x_1^{(3)} (=x_1)$ which appear at the output terminals 18a–18c. The next three encoded data sequence $x_2^{(1)}), x_2^{(2)}), x_2^{(3)}(=x_2)$ are functions of the first two information symbols $u_1$ and $u_2$, and the following three encoded symbols $x_3^{(1)}), x_3^{(2)}), x_3^{(3)})(=x_3)$ are functions of $u_1, u_2, u_3$, and so forth. This dependence of the encoded data sequence upon the inputted information symbol sequence imposes a treelike structure on the set of the encoded data sequences, which is illustrated in FIG. 2.

Referring to FIG. 2, the leftmost node of code tree, indicated by a black circle, is called an origin node, while the rightmost nodes of the code tree are respectively called terminal nodes. The leftmost symbol triplets 111 and 000 along the upper and lower branches stemming from the origin node, correspond to the responses of the encoder 10 to the initial information symbol (viz., $u_1$) 1 or 0. Branching off to the right from the response 111 to an initial 1 are the responses to a 1 or 0 following an initial 1, and so forth. By way of example, the response of the encoder 10 to the information sequence $u_1=1, u_2=1, u_3=0, u_4=0$ is highlighted in the tree code of FIG. 2.

As mentioned above, the encoder 10 forms a path through the code tree corresponding to an incoming information symbol sequence to be encoded. It follows that sequential decoding can be regarded as the process of determining the path in the code tree which was followed by the encoder. That is to say, a sequential decoder reconstructs the encoder's path through the tree on the basis of the received data sequence.

FIG. 3 is a diagram showing a code tree for use in sequentially decoding a received data sequence. Although the code tree of FIG. 3 is exactly identical to that shown in FIG. 2 (viz., replica of code tree of FIG. 2), it is reiterated for the sake of convenience of description.

Assuming that the encoder 10 of FIG. 1 outputs a data sequence 111 101 001 000 which is transmitted to a receiver via a binary symmetrical communication channel, and the received data sequence is 101 101 001 000 due to deterioration during the transmission over a noisy channel. In this case, the second bit of the first block is erroneously received.

As mentioned above, the first three symbols (bits) of the received data sequence should be either 111 or 000, and in this particular case, it is hypothesized that the first three symbols transmitted are 111 in that the Hamming distance is shorter than the other triplet 000. If this assumption is correct, it is hypothesized that the next three symbols are 101, and in a similar manner, it is further hypothesized that the following symbols are 001 000. That is, it is hypothesized that the data sequence 111 101 001 000 has been transmitted as highlighted in a bold line in FIG. 3. The sequential hypothesizing as mentioned above is able to reduce the number of data sets (i.e., 111, 001, . . . along each branch) to be searched only two at each of the hypothesizing operations in this case.

As in the above case, assuming that the data sequence 111 101 001 000 has been transmitted. However, in this instance, it is assumed that due to more noisy channel circumstances, the received data sequence is contaminated as 010 101 001 000. In such a case, it is hypothesized that the first three symbols are 000 due to the shorter Hamming distance. Since this hypothesis is correct, it follows that the following code symbols are hypothesized as 111 101 001. Thus, the data sequence received is hypothesized as 000 111 101 001 as indicated by a phantom line in FIG. 3. In this case, however, 4 symbol (bits) are erroneously presumed. This implies that once an erroneous hypothesis is made, the subsequently decoded symbols tend to be rendered uncorrelative or irrelevant with the received data sequence.

Throughout the instant disclosure, a term "path" implies a trail or passage from the origin node to a certain point (node) in the tree, or the most likely path up to a certain terminal node in the tree (viz., solution of the decoder). Further, a partial sequence $\underline{x}_j$ denotes a path at j-th level in the code tree as shown in FIG. 3. As will be understood, the number of paths at the level 1 (viz., $x_1$) is two, and that at the level 2 (viz., $x_2$) is four, and so on. However, the partial sequences at the same level will not be discriminated with one another in the following descriptions.

In FIG. 3, a plurality of nodes in the code tree are denoted by n0, n1(1), n1(2), n2(1), . . . , n4(15), and n4(16), while a plurality of branches in the tree are denoted by b1(1), b1(2), . . . , b4(15), and b4(16).

The decoder is configured such as to notice that if the decoded data symbols are found to deviate from those of the received data sequence in excess of a predetermined threshold, the previous hypothesis has been erroneous. More specifically, if the decoder notices that the earlier hypothesis is erroneous at a given preceding node, the decoder returns to this node, changing the suspected branch (or node), and proceeds along a new branch or path in the tree. Each of these successive hypotheses is able to reduce the number of selections to be checked, simplifying the succeeding hypothesizing operations, and being able to give the information via which the correctness of earlier hypothesis can be determined.

FIGS. 4A–4C are diagrams schematically illustrating a set of rules according to the sequential decoding algorithm, which rules consists of three kinds of moves: forward, lateral, and backward of the decoder (or the moves of a pointer). On the forward move (FIG. 4A), the decoder advances the pointer along one branch b2(1) to the right in the code tree from the previously hypothesized node. The lateral move (FIG. 4B) is a move from one node b2(1) to another b2(2). In more specific term, on the lateral move, the pointer moves backward to the node from which the branch b2(1) stems, after which the pointer advances along the node b2(2). The backward move (FIG. 4(c)) is that the decoder retreats the pointer along one branch b2(1) to the previously examined branch b1(1) in the code tree.

The principle of the Fano algorithm is described in a paper entitled "A Heuristic Discussion of Probabilistic Decoding" by Robert M. Fano, IEEE Transactions of Information Theory, Vol. IT-9, p. 64–74, April 1963, or a book entitled "Information Theory and Reliable Communication" by Robert G. Gallager, John Wiley & Sons, Inc., 1968.

As to the history of the sequential decoding, reference should be made, for example, to a paper entitled "Backtrack Programming" by Solomon W. Golomb and Leonard D. Baumert, Journal of the Association for Computing Machinery, Vol. 12, No. 4, pp. 516–524, October 1965.

Prior to implementing the sequential decoding, the decoder previously stores the code tree which is a replica of that in an encoder and has been exemplified in FIG. 3. The code tree stored in the decoder typically takes the form of a look-up table which includes a plurality of branches (or nodes) with the logical relationship therebetween. That is to say, the branches (or nodes) can be specified using memory addresses each of which may be referred to as the pointer in the instant disclosure.

As mentioned above, the Fano algorithm is to decode the inputted data sequence, which can be represented in a tree structure, by discarding an improbable path (node or branch) and search new one through the code tree.

The Fano algorithm however is in fact more complicate. FIG. 5 is a table showing the operation rules of the conventional Fano algorithm, which table is given in the aforesaid book by Galleger. In FIG. 5, T denotes a threshold, and Γ denotes a path metric called the Fano metric and is given by $$\Gamma(\underline{x}_j) = -log\{p(\underline{y})/p(\underline{y}|\underline{x}_j)\} - B(\underline{x}_{j-1}) \quad (1)$$

where $p(\underline{y})$ is a probability of occurrence of an inputted data sequence $\underline{y}$ in the tree, $p(\underline{y}|\underline{x}_j)$ is a probability of occurrence of the data sequence $\underline{y}$ under the condition that a path $\underline{x}_j$ of length (or depth) j in the tree occurs, and $p(\underline{x}_j)$ is a probability of occurrence of the path $\underline{x}_j$ of length j in the tree. Further, $B(\underline{x}_{j-1})$ of equation (1) represents a bias in connection with the path $\underline{x}_{j-1}$ in the tree, and is selected such that if $\underline{x}_j$ is a path forming part of the maximum likelihood (most likely) path, the expected value of $\Gamma(\underline{x}_j)$ becomes positive, and otherwise, the expected value of $\Gamma(\underline{x}_j)$ becomes negative.

Further, in FIG. 5, the character "I" denotes increment of the threshold T. More specifically, "I" implies that the threshold T is incremented by $t\Delta$ (viz., $T=T+t\Delta$) where t is the maximum integer satisfying $\Gamma(\underline{x}_j) - \Delta < T + t\Delta \leq \Gamma(\underline{x}_j)$. Still further, the character "N" represents no change of the threshold T, and "D" the decrement of the threshold T (viz. $T=T-\Delta$). Still further, in FIG. 5, "F" denotes a forward move of the pointer so as to examine a subsequent branch or node in the code tree, "L" a lateral move of the pointer, and "B" a backward move of the pointer.

As is well known in the art, according to the Fano algorithm, the decoder will move forward through the code tree as long as the metric value along a path being examined continues to increase. When the metric value falls below a threshold, the decoder retreats and starts to examine other path leaving the same node. If no path stemming from the same node can be found whose path metric exceeds the threshold, the threshold is decreased and the decoder attempts to move forward again with a decreased threshold. No node (or branch) is ever examined twice with the same threshold, and accordingly, the decoder is not trapped in a loop.

It is understood, from the just-mentioned brief descriptions of the Fano algorithm, that this algorithm is able to markedly improve the process time compared to unconditionally checking all nodes (or branches). Therefore, the Fano algorithm has found extensive application in the filed of error control decoding. As an example of a practical use of the Fano algorithm, reference should be made to U.S. Pat. No. 3,665,396.

It is known in the art that if a code rate R is smaller than a computational cutoff rate $R_{comp}$, the average time of computation, needed to search the most likely path through the code tree in the Fano algorithm, is proportional to the length $N(\underline{x})$ of the most likely path. The code rate R is a ratio of the number of bits needed to represent one symbol of information sequence (viz., input to an encoder) to the number of bits needed to represent one symbol of data sequence (viz., output of the encoder). On the other hand, the computational cutoff rate $R_{comp}$ is determined depending on the above-mentioned probabilities $p(\underline{y})$, $p(\underline{y}|\underline{x}_j)$ and $p(\underline{x}_j)$ and is a little bit smaller than an entropy H of the information symbol sequence.

However, the conventional Fano algorithm has encountered the difficulties that provided that the paths in the code tree do not occur equiprobably, it is often the case that the average time of computation until determining the most likely path in the tree, is not proportional to the length $(N(\underline{x}))$ of the most likely path and thus liable to diverge. This is because if the paths in the code tree do not occur equiprobably, the value corresponding to the entropy H of the information symbol sequence becomes smaller, thereby lowering the computational cutoff rate $R_{comp}$. Further, if the value corresponding to the code rate R becomes larger than that corresponding to $R_{comp}$, the average time of computation for searching the most likely path in the tree is no longer proportional to the length $N(\underline{x})$ thereof, and thus resulting in the fact that the number of computing processes diverges. In practice, however, since the number of the paths in the code tree is finite, such a problem of divergence may be somewhat rare. Nonetheless, in the case where the paths in the code tree do not occur equiprobably, the amount of computation increases to an extent of practically unacceptable level.

Accordingly, the conventional Fano algorithm has not ever been applied to the technical fields such as pattern recognition, speech recognition, etc. wherein the paths in the code tree occur equiprobably.

SUMMARY OF THE INVENTION

It is therefore an object of the present invention to provide a sequential decoding apparatus which is well suited to decode an incoming data sequence in an application such as pattern recognition, speech recognition, etc. wherein the partial sequences in the code tree do not occur equiprobably.

Another object of the present invention is to provide a sequential decoding method which is well suited to decode an incoming data sequence in an application such as pattern recognition, speech recognition, etc. wherein the partial sequences in the code tree do not occur equiprobably.

In brief, these objects are achieved by the techniques wherein in order to sequentially decode a plurality of symbol sets of an incoming data sequence with less amount of computation in an application wherein paths in a code tree do not occur equiprobably, a code tree is previously memorized in a decoder. This code tree comprises a plurality of paths defined by a plurality of sequences of nodes. A pointer generator is provided for generating a pointer that defines a node that specifies a path in the code tree. A plurality of branch metric generators each generates a metric of a branch which forms part of a path and which is to be examined with a corresponding symbol set of the incoming data sequence. Further, a plurality of path metric generators are provided which respectively receive the branch metrics from the plurality of branch metric generators and respectively generate path metrics using the branch metrics. A controller controls the pointer generator and the plurality of path metric generators such as to maximize each of the plurality of path metrics at each of decoding steps for sequentially decoding the symbol sets of the incoming data sequence.

One aspect of the present invention resides in an apparatus for sequentially decoding a plurality of symbol sets of an incoming data sequence. The apparatus comprises a memory for storing a code tree which comprises a plurality of paths defined by a plurality of sequences of nodes. A pointer generator is provided for generating a pointer which defines a node which specifies a path in the code tree. A plurality of branch metric generators are also provided, each of which generates a metric of a branch which forms part of a path and which is to be examined with a corresponding symbol set of the incoming data sequence. A plurality of path metric generators respectively receive the branch metrics from the plurality of branch metric generators and respectively generate path metrics using the branch metrics. A controller controls the pointer generator and the plurality of path metric generators such as to maximize each of the plurality of path metrics at each of decoding steps for sequentially decoding the symbol sets of the incoming data sequence.

Another aspect of the present invention resided in a method sequentially decoding a plurality of symbol sets of an incoming data sequence by way of data search through a code tree stored in a memory. The code tree comprises a plurality of paths defined by a plurality of sequences of nodes. The method includes the steps of: (a) generating a pointer which defines a node which specifies a path in the code tree; (b) generating a plurality of branch metrics each of which relates to a branch which forms part of a path and which is to be examined with a corresponding symbol set of the incoming data sequence; (c) determining a plurality of path metrics using the plurality of branch metrics; and (d) controlling the generation of the pointer and the determination of the plurality of path metrics such as to maximize each of the plurality of path metrics at each of decoding steps for sequentially decoding the symbol sets of the incoming data sequence.

BRIEF DESCRIPTION OF THE DRAWINGS

The features and advantages of the present invention will become more clearly appreciated from the following description taken in conjunction with the accompanying drawings in which like elements or portions are denoted by like reference numerals and in which:

FIG. 5 is a diagram showing operation rules of the conventional Fano algorithm;

FIG. 6 is a diagram showing operation rules of the sequential decoding algorithm according to a first embodiment of the present invention;

FIG. 8 is a flow chart which shows the steps which characterize the sequential decoding according to the first embodiment of the present invention;

FIG. 15 is a block diagram schematically showing one example of the sequential decoder according to the second embodiment of the present invention;

FIG. 19 is a functional table showing the operation of another block which forms part of the sequential decoder of FIG. 17 in detail.

DETAILED DESCRIPTION OF THE PREFERRED EMBODIMENTS

Figure 1:
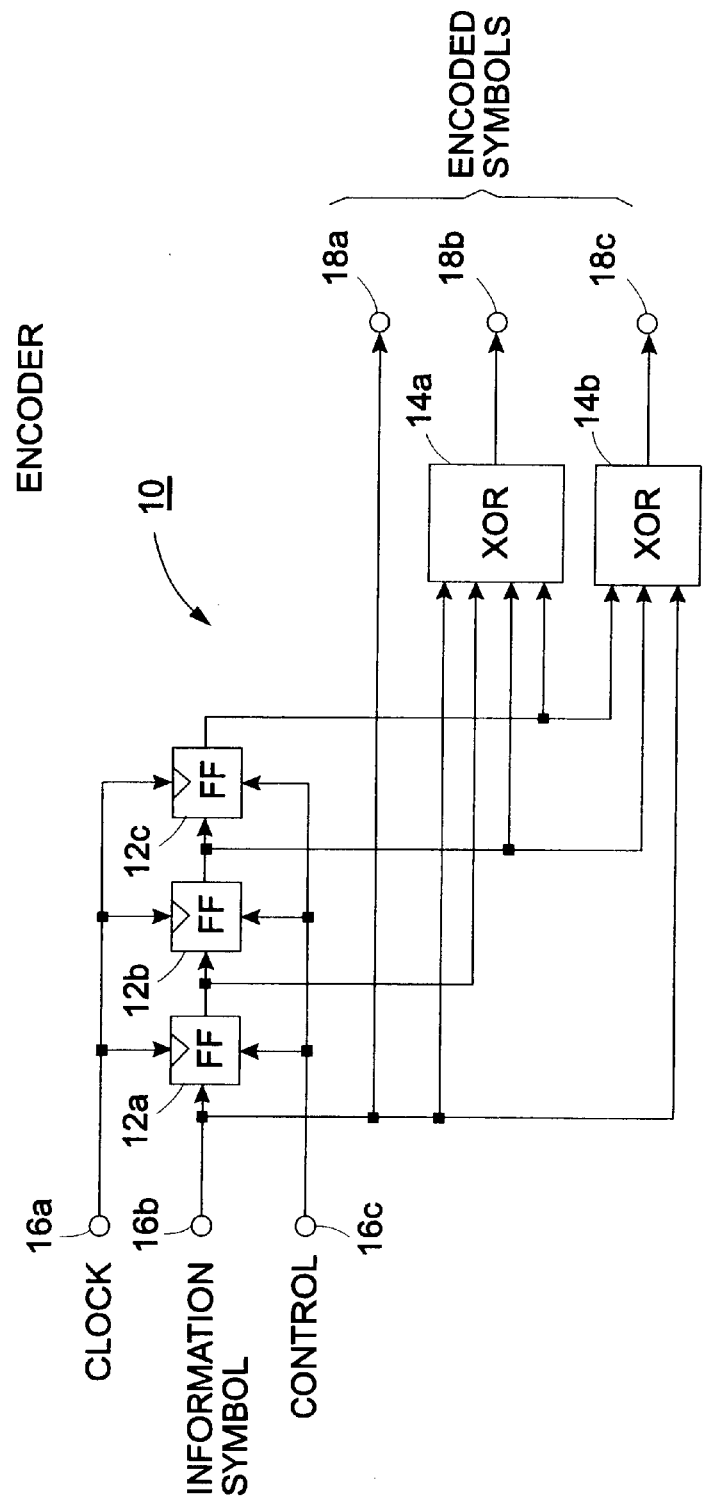
FIG. 1 is a block diagram schematically showing one example of convolutional encoder, this figure having been referred to in the opening paragraphs of the instant disclosure.
Figure 2:
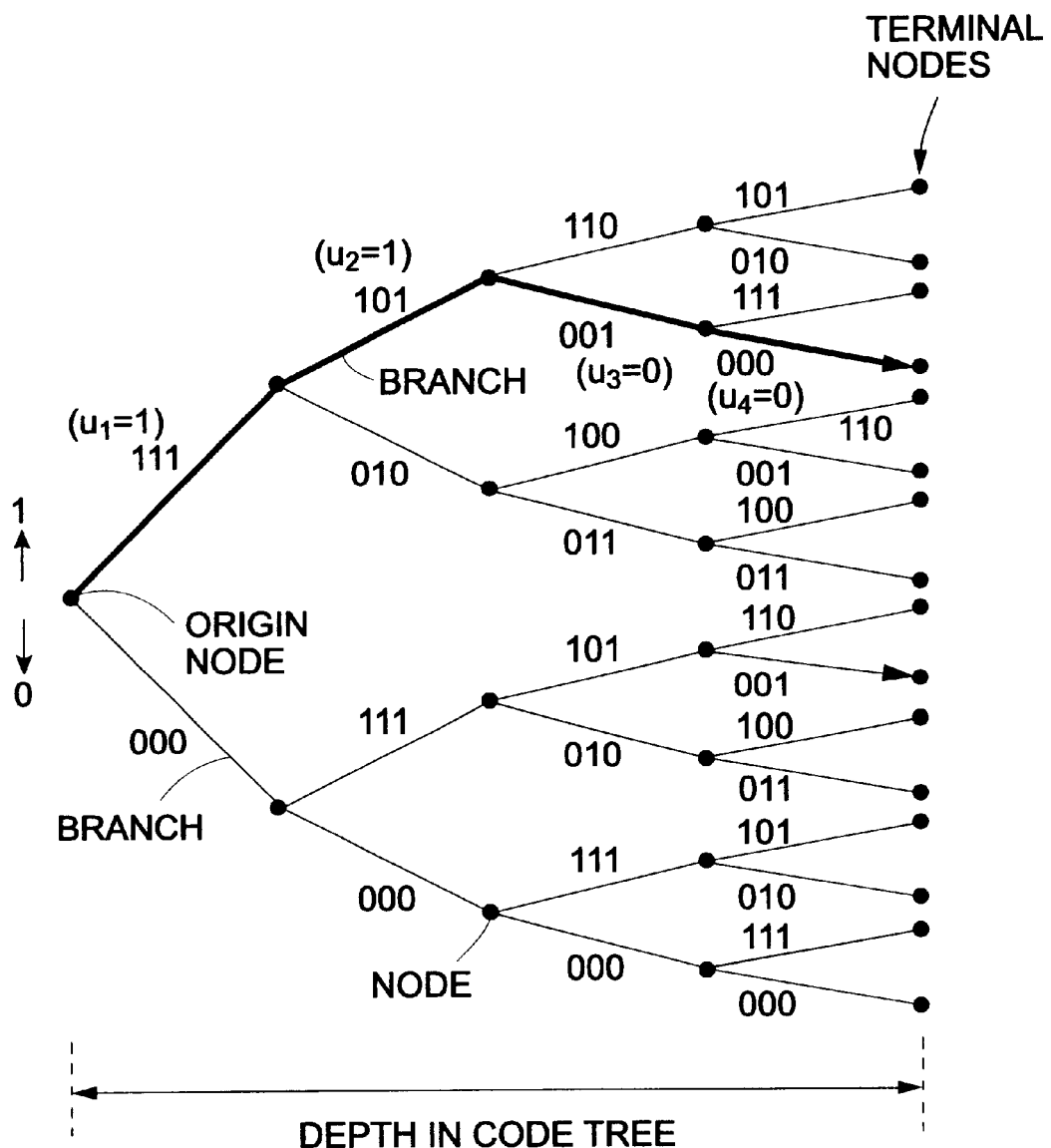
FIG. 2 is a diagram schematically showing a code tree for use in describing the operation of the encoder of FIG. 1.

Before turning to a first embodiment of the invention, the principle underlying the present invention will be described.

According to the present invention, a new path metric is introduced into the Fano algorithm in addition to the conventional Fano metric, which new path metric will be referred to a second (path) metric. A path search through the code tree is implemented such as to maximize the Fano metric and the second metric together at each decoding step (viz., step for decoding one symbol set of incoming data sequence). The Fano metric, which will be denoted by $\Gamma_1$ in the following description, is identical to that of equation (1) and thus given by $$\Gamma_1(\underline{x}_i) = -\log\{p(\underline{y})/p(\underline{y}|\underline{x}_j)\} - B_1(\underline{x}_{j-1}) \quad (2)$$

The first and second terms of equation (2) have already been referred to in the opening paragraphs and hence further descriptions thereof will be omitted for brevity.

In the conventional Fano algorithm, a path whose metric has a large value in terms of $\log\{p(\underline{y})/p(\underline{y}|\underline{x}_j)\}$ (equation (2)) is preferentially searched under the condition that the bias $B(\underline{x}_{j-1})$ is properly selected. In order to enhance or improve this preferential tree search of the conventional Fano algorithm so as to meet the situation wherein the paths to be searched do not occur equiprobably, the invention adopts the second path metric $\Gamma_2(\underline{x}_j)$ as set forth below.

$$\Gamma_2(\underline{x}_i) = \log\{p(\underline{x}_j)\} - B_2(\underline{x}_{j-1}) \quad (3)$$

where $p(\underline{x}_j)$ represents a probability of occurrence of a path $\underline{x}_j$, in the code tree, and $B_2(\underline{x}_{j-1})$ is a bias corresponding to $B_1(\underline{x}_{j-1})$. More specifically, the bias $B_2(\underline{x}_{j-1})$ is selected such that an expected value of $\Gamma_2(x_i)$ becomes positive if $x_j$ is a partial sequence of the most likely path, and becomes negative if $x_j$ is a partial sequence of an improbable path.

Clearly, in the case where $p(\underline{x}_j)$ exhibits a large value, the value of the first term "$\log\{p(\underline{x}_j)\}$" of equation (3) becomes large as well. As such, if a path search through the code tree is implemented so as to maximize the two path metrics $\Gamma_1$ and $\Gamma_2$ at each decoding step, the most likely path tends to be searched in a preferential manner because $-\log\{p(\underline{y})/p(\underline{y}|\underline{x}_j)\}$ (equation (2)) and $\log\{p(\underline{x}_j)\}$ (equations (3)) respectively exhibit large values at each decoding step. In other words, in accordance with the present invention, even if the paths in the code tree do not occur equiprobably, an attempt to search the most likely path in the tree can effectively be carried out with extensively small amount of computations relative to the conventional Fano algorithm.

However, it is not easy to determine the actual rules of tree search for practically performing the underlying principle of the invention thus far mentioned. This is because, according to the conventional Fano algorithm, only a single action can be implemented at a time, and thus it is unable to independently change the two pairs of metric and threshold (i.e., ($\Gamma_1$, $T_1$) and ($\Gamma_2$, $T_2$)). In addition, it appears intuitively that the maximization of these two metrics at each of the decoding steps might boost the number of operation rules to a practically unacceptable extent.

Fortunately, however, there exist some clues that serve to determine the rules of the tree search via which the principle of the present invention can practically be realized. One of the clues is that the tree search at each decoding step (i.e., step for decoding one symbol set of the received data sequence), which accompanies the concurrent maximization of the two metrics $\Gamma_1$ and $\Gamma_2$, is an extension of the conventional Fano algorithm. Therefore, if one of the two metrics $\Gamma_1$ and $\Gamma_2$ increases monotonously, the rules of the tree search becomes identical to those of the conventional Fano algorithm. Another clue is that since the two metrics $\Gamma_1$ and $\Gamma_2$ are maximized at each decoding step (in other words, since $\Gamma_1$ and $\Gamma_2$ are equivalent with each other), the rules of the tree search should be symmetrical with respect to $\Gamma_1$ and $\Gamma_2$, which implies that the rules should remain unchanged even if $\Gamma_1$ and $\Gamma_2$ are exchanged.

After several efforts on a trial-and-error basis in order to practically realize the aforesaid principle of the invention, the inventors determined the rules of tree search for finding out the most likely path while maximizing the two metrics $\Gamma_1$ and $\Gamma_2$ at each decoding step in the environments wherein the paths do not occur equiprobably. The tree search rules thus determined are shown in FIG. 6, which are arranged in a manner similar to that of FIG. 5. The operation rules listed in FIG. 6 can be understood without difficulty from the foregoing descriptions of FIG. 5.

Figure 7A:
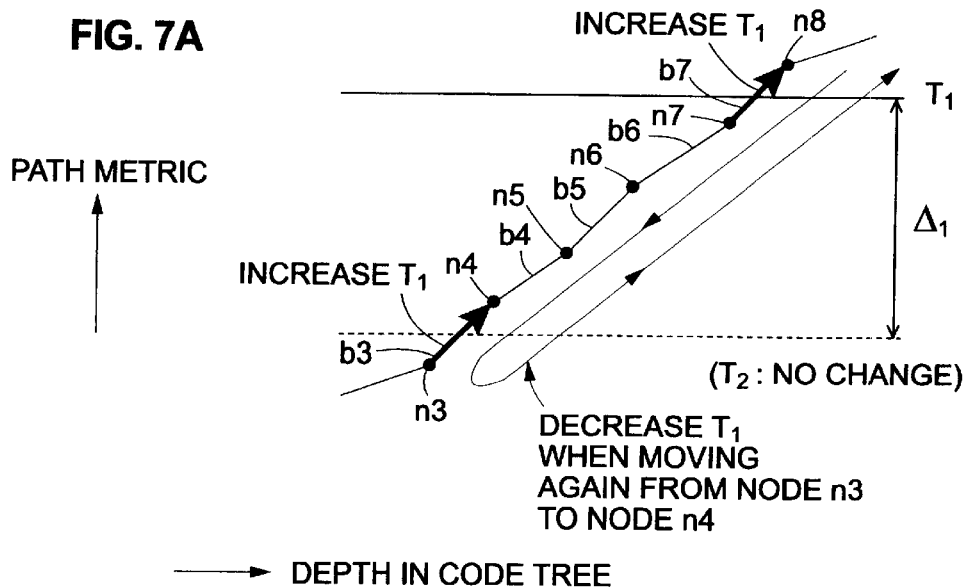
FIGS. 7A–7B are diagrams schematically showing that the sequential decoding algorithm according to the first embodiment of the present invention is not trapped in a loop.
Figure 7B:
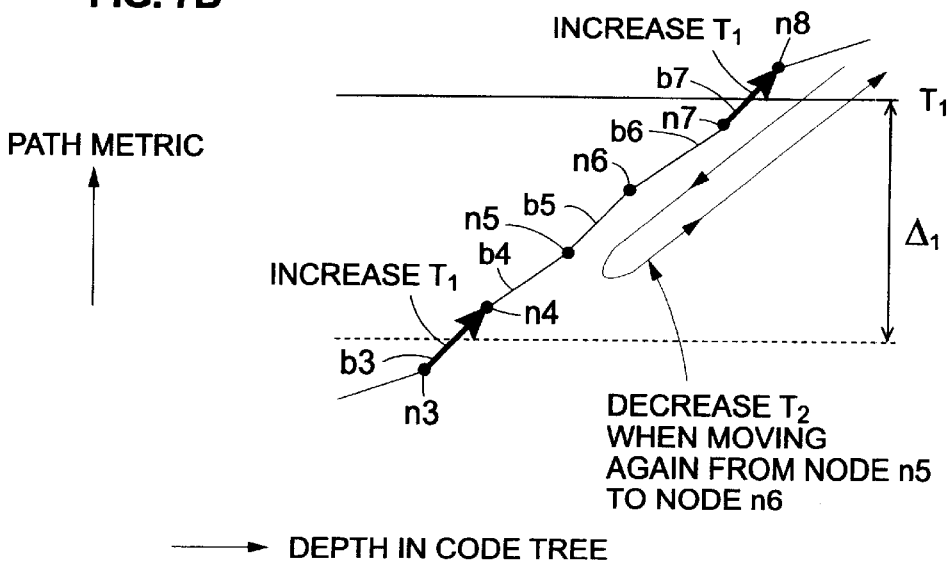

It will be described, with reference to FIGS. 7A and 7B, that the tree search, which is performed according to the rules shown in FIG. 6, can be implemented without being trapped in a loop. In FIGS. 7A and 7B, the vertical and horizontal axes respectively denote the path metric and the depth in the tree, a zigzag line denoting a sequence of branches (or nodes) in the tree, and each of horizontal solid and phantom lines indicates the threshold $T_1$.

Referring to FIG. 7A, one example of the tree search is illustrated with the threshold $T_2$ remaining unchanged. The decoder moves forward the pointer from node n3 to n4 with increment of threshold $T_1$ according to Rule 1.1 of FIG. 6. Thereafter, the decoder further moves forward the pointer from node n7 to n8 with increment of threshold $T_1$ by $\Delta_1$. Following this, the decoder moves backward the pointer from the node n8 to n3, after which the pointer again moves forward from node n3 to n4 with the threshold $T_1$ being lowered by $\Delta_1$ and again goes to node n8 by way of nodes n4–n7. In this case, the branch b7 is reexamined with the threshold $T_1$ that is different from the previous value of $T_1$, and accordingly, it is possible to prevent the algorithm from being trapped in a loop as in the conventional Fano algorithm.

FIG. 7B shows another example of the tree search. In this instance, as in the case of FIG. 7A, assuming that the decoder moves forward the pointer from node n3 to n4 while increasing the threshold $T_1$ according to Rule 1.1 of FIG. 6, and thereafter, the decoder further moves forward the pointer from node n7 to n8 with increment of threshold $T_1$ by $\Delta_1$. Subsequently, the decoder retreats the pointer from node n8 to node n5, at which the decoder again advances the pointer from node n5 to node n6 while decreasing the threshold $T_2$ in accordance with Rule 4.2 of FIG. 6. In this case, the decoder reexamines branch b7 using the same thresholds $T_1$ as in the previous search of branch b7. However, fortunately, as mentioned above, the threshold $T_2$ has been changed at the branch b5, and as such, the branch b7 is reexamined with different threshold pair of $T_1$ and $T_2$. To iterate, according to the present invention, no node (or branch) is ever examined twice with the same threshold pair ($T_1$, $T_2$), and accordingly the algorithm is not trapped in a loop.

FIG. 8 is a flow chart which shows the steps which characterizes the sequential decoding according to the first embodiment of the invention. As shown in FIG. 8, the routine starts with step 30, at which a decoder initializes the thresholds $T_1$ and $T_2$ to zero, and sets an address of the origin node to the pointer. Further, at step 30, the decoder initializes the two path metrics $\Gamma_1$ and $\Gamma_2$ to zero. Although not shown in FIG. 8, at step 30, the decoder then advances the pointer to one of the first nodes leaving from the origin node, and, at step 32, calculates the two metrics $\Gamma_1(\underline{x}_j)$ and $\Gamma_2(\underline{x}_j)$. It is to be noted that the suffix "j" in the flow of FIG. 8 takes "1"

until the routine returns to step 32 for the first time. Once the routine returns to step 32, the suffix "j" is unable to be specified because the pointer moves forward or backward or laterally in the code tree. In order to simplify the description of FIG. 8 flow chart, the following processes begin with calculating $\Gamma_1(\underline{x}_i)$ and $\Gamma_2(\underline{x}_i)$.

As mentioned above, the pointer determines the path $\underline{x}_i$. Subsequently, the routine proceeds to step 34 at which a check is made to determine if the pointer reaches a terminal node and at the same time if $\Gamma_1(\underline{x}_i) \geq T_1$ and $\Gamma_2(\underline{x}_i) \geq T_2$. If the inquiry made at step 34 is affirmative (YES), the routine terminates, and otherwise (NO), the routine proceeds to step 36.

At step 36, the comparison indicated in the table of FIG. 6 are implemented using $\Gamma_1(\underline{x}_{i-1}), \Gamma_1(\underline{x}_i), \Gamma_2(\underline{x}_{i-1}), \Gamma_2(x_i), T_i, T_2, \Delta_1,$ and $\Delta_2$, and the program goes to step 38. At this step 38, depending on the comparison results obtained at step 36 and on whether the pointer is able to move laterally, the decoder determines the values of the threshold levels $T_1$ and $T_2$, and also determines the subsequent pointer's move (viz., forward, backward, or lateral). Following this, the routine advances to step 40(1).

In the following, the three kinds of threshold changes are represented by "I", "N", and "D" which respectively indicate "increment", "no-change" and "decrement" of the threshold. Further, the three kinds of pointer moves to be taken are indicated by "F", "L", and "B" which respectively depict "forward", "lateral" and "backward".

At step 40(1), a check is made to determine as to which step the routine should proceed to among steps 42(1), 44(1), and 40(2) depending on the result (i.e., "I", "N" or "D") decided at step 38. If the decision made at step 40(1) indicates that the routine goes to step 42(1), the decoder lowers the threshold $T_1$ thereat according to Rule 4.1 of FIG. 6, after which the routine goes to step 40(2). On the other hand, if decoder instructs that the routine goes to step 44(1) on the basis of the result at step 38, the decoder raises, at this step, the threshold $T_1$ in accordance with Rule 1.1.

If the decision made at step 40(1) instructs the routine to proceed to step 40(2), no change occurs in the value of $T_1$. The procedures, which are substantially identical to those at steps 40(1), 42(1), and 44(1), are implemented at steps 40(2), 42(2), and 44(2) in terms of the threshold $T_2$. If the decision made at step 40(2) indicates that the routine goes to step 42(2), the decoder decreases the threshold $T_2$ thereat according to Rule 4.2 of FIG. 6, after which the routine goes to step 46. On the other hand, if decoder instructs that the routine goes to step 44(2) according to the result obtained at step 38, the decoder increases, at this step, the threshold $T_2$ in accordance with one of Rule 1.2.

As mentioned above, since the two pairs of metric and threshold are used, two step blocks are necessary, one of which includes steps 40(1), 42(1), 44(1) and the other includes steps 40(2), 42(2) and 44(2). Subsequently, at step 46, a check is made to determine as to which step the routine should go to among steps 48, 50, 52 in accordance with the result at step 38. At step 48, the pointer moves backward, after which the program returns to step 32 via step 54 at which "j" is changed. At step 50, the pointer moves laterally and subsequently the routine returns to step 32 via step 54, in the case of which a branch is changed in the same depth in the tree. Further, at step 52, the pointer moves forward and the routine goes back to step 32 via step 54.

Figure 9:
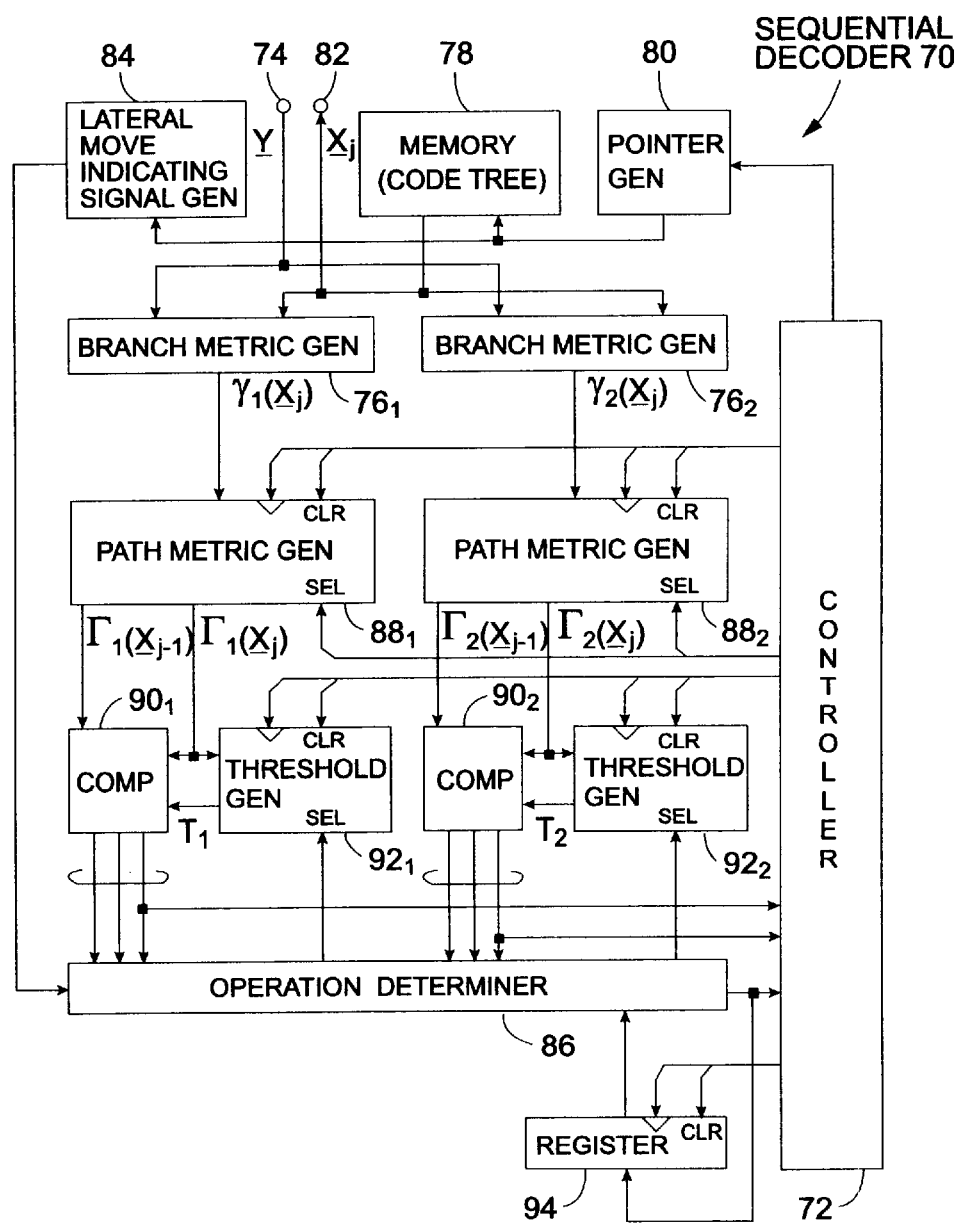
FIG. 9 is a block diagram schematically showing one example of the sequential decoder according to the first embodiment of the present invention.

FIG. 9 is a block diagram schematically showing a sequential decoder (depicted by reference numeral 70) according to the first embodiment of the invention. A controller 72 is provided to supervise the overall operation of the decoder 70 using a program stored in an appropriate memory (not shown). For the sake of simplifying the drawing, some of control and data lines extending from the controller 72 to the blocks are omitted in the figure.

Figure 3:
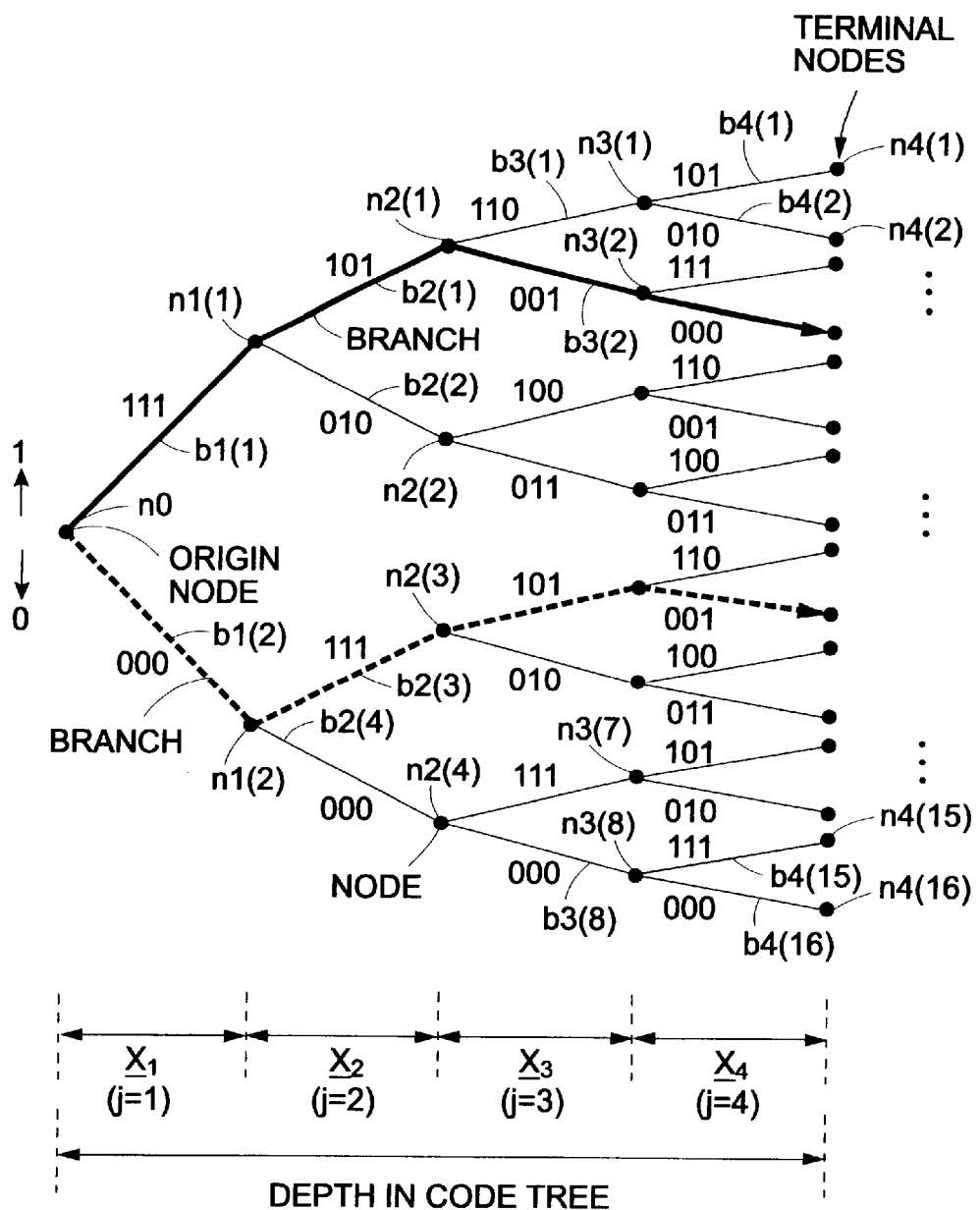
FIG. 3 is a diagram schematically showing a code tree, which is a replica of the code tree of FIG. 2 and which is used in a decoder.
Figure 4A:
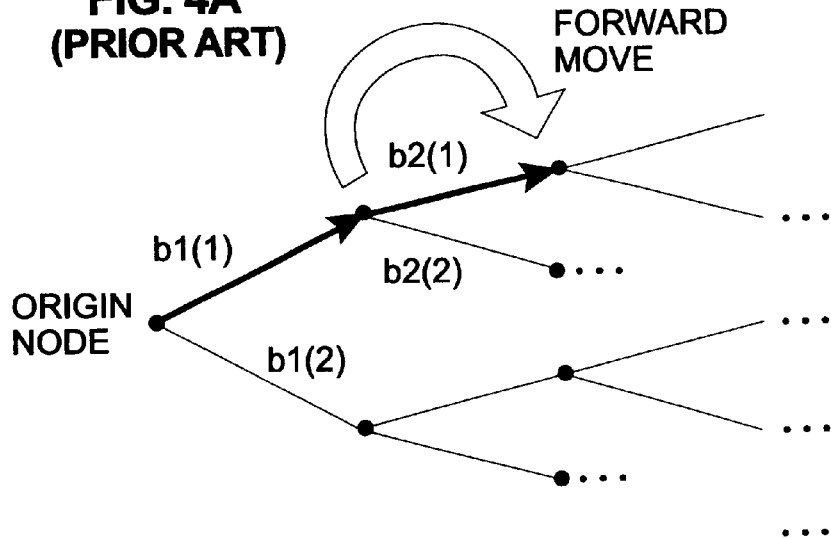
FIGS. 4A–4C are diagrams showing pointer's moves in the decoder according to the conventional Fano algorithm.
Figure 4B:
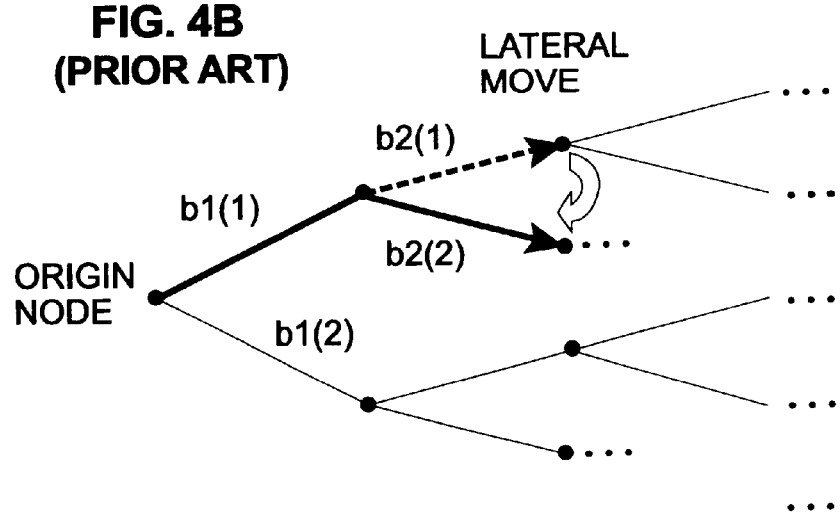
Figure 4C:
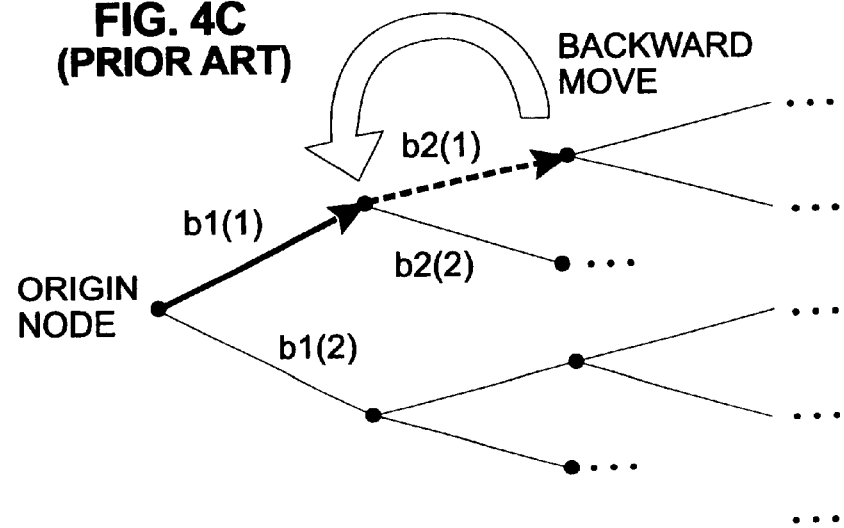

In FIG. 9, a data sequence y is applied, via an input terminal 74, to two branch metric generators $76_1$ and $76_2$. A memory 78, which typically takes the form of read-only-memory (ROM), previously stores a code tree such as shown in FIG. 3 (for example). A pointer generator 80, in response to an address control signal from the controller 72, supplies the memory 78 with a pointer, which indicates an address of node in the code tree and thus specifies a path in the tree. The memory 78 is responsive to the pointer applied thereto and outputs the data of the path $\underline{x}_j$ (j=1, 2, . . . , j) defined by the pointer. The data of the path $\underline{x}_j$ thus derived from the memory 78 is applied to the branch metric generators $76_1$ and $76_2$ and also to an output terminal 82. As an alternative, it is possible to apply the branch, defined by the pointer, to the branch metric generators $76_1$ and $76_2$ as will be understood as the description proceeds.

The pointer generator 80 comprises a register for temporarily storing the pointer (viz., address) and a suitable memory such as a ROM (neither shown). This memory provided in the pointer generator 80 previously stores a plurality of addresses which respectively indicate the nodes of the code tree stored in the memory 78. The pointer generator 80 operates such as to control the pointer's move (viz., forward, lateral, or backward) according to the control signal applied thereto from the controller 72.

Since each of the blocks 78 and 80 is of conventional type and well known in the art, the details thereof will not be given to simplify the description of the instant disclosure. For details, reference should be made, for example, to a book entitled "Data Abstraction and Problem Solving With C++, Walls and Mirrors" by Frank M. Carrano, published 1995 by The Benjamin/Cummings Publishing Company, Inc., Redwood City, Calif. 94065.

A lateral move indicating signal generator 84 is provided such as to receive the pointer from the pointer generator 80 and determines if the pointer is able to move laterally. If the lateral move of the pointer is possible, the generator 84 issues a logic level 1 (for example), and otherwise, outputs a logic level 0, which logic level (1 or 0) is fed to an operation determiner 86 as a lateral move indicating signal.

The lateral move indicating signal generator 84 can be configured using straightforward logic circuitry in the event that the pointer is provided with a predetermined number of lower bits whose logic levels are set as follows. Provided that a branch stemming from a given node is the last one to be examined, the lower bits of the pointer are all set to logic level 1s, and otherwise, at least one bit of the predetermined lower bits is set to logic level 0 with all the remaining ones being set to logic level 0s. With the change of the lower bits depending on the aforesaid situation, the generator 84 can be configured so as to compute NAND of the above-mentioned predetermined lower bits.

In order to simplify the following description, a suffix k is used to denote two blocks or two metric values (viz., k=1, 2), or to denote one of them (k=1 or 2). As mentioned above, the branch metric generators $76_k$ are supplied with a set of data symbols of the inputted data sequence y through the input terminal 74, the data of path $\underline{x}_j$ (or branch data corresponding to the set of inputted data symbols) from the code tree memory 78. The computation results $\gamma_k(\underline{x}_j)$ obtained at the branch metric generators $76_k$ are respectively applied to path metric generators $88_k$ (k=1, 2).

In order to automatically prevent the pointer from further retreating when returning to the origin node, it is preferable to introduce $\gamma_1$(NULL) and $\gamma_2$(NULL) each of which is a sufficiently large value wherein NULL indicates data of length 0.

Since each of the path metric generators $88_k$ has already stored therein the previously calculated path metric $\Gamma_k(\underline{x}_{j-1})$, it is possible for each of the generators $88_k$ to obtain or calculate a new path metric using the corresponding branch metric applied thereto, the detail of which will be described later. The path metrics $\Gamma_k(\underline{x}_j)$ and $\Gamma_k(\underline{x}_{j-1})$ determined at each of the generators $88_k$ are applied to a corresponding comparator $90_k$ (k=1 or 2), while the path metric $\Gamma_k(\underline{x}_j)$ is applied to a corresponding threshold generator $92_k$ (k=1 or 2).

Each of the threshold generators $92_k$, in addition to the above-mentioned path metric $\Gamma_k(\underline{x}_j)$, receives a selector control signal indicative of "decrement", "no-change" or "increment" of threshold in connection with the current decoding step from the operation determiner 86. The selection control signal has been stored in a register 94. Further, each of the threshold generators $92_k$ is supplied with a control signal from the controller 72, which also will be described later in connection with FIG. 12. Subsequently, each of the threshold generators $92_k$ generates the threshold $T_k$ (k=1 or 2) which is applied to the corresponding comparator $90_k$.

The comparators $90_k$ respectively carry out the following comparisons $$\Gamma_k(\underline{x}_{j-1}) < T_k \qquad (4)$$

$$\Gamma_k(\underline{x}_{j-1}) < T_k + \Delta_k \qquad (5)$$

$$\Gamma_k(\underline{x}_j) \geq T_k \qquad (6)$$

All of these three comparison results are applied to the operation determiner 86, while the comparison result $\Gamma_k(\underline{x}_j) \geq T_k$ is fed to the controller 72.

Summing up, the operation determiner 86 is supplied with the following information: the lateral move indicating signal from the generator 84, the three kinds of comparison results from the comparators $90_k$. The operation determiner 86 further receives the pointer's move at the current decoding step from the register 94. Subsequently, the operation determiner 86, using the above-mentioned data applied thereto, decides the operation to be taken (viz., the change of threshold $T_k$ and the pointer's move). The data indicating the next operation, decided at the operation determiner 86, is stored in the register 94.

Before the decoder 70 of FIG. 9 starts sequential decoding of an incoming data sequence $\underline{y}$, the register 94 is supplied with a clock pulse from the controller 72 while receiving a logic level 0 at a CLR terminal from the controller 72, whereby the register 94 is initialized such as to store a control data indicating the forward move of the pointer. On the other hand, after starting the sequential decoding, when the register 94 receives a clock pulse while receiving a logic level 1 at CLR terminal, both from the controller 72, the register 94 stores the data indicating the next operation generated from the operation determiner 86.

The controller 72 is supplied with the above-mentioned data from the comparators $90_k$ and the operation determiner 86, and applies the control signals to the pointer generator 80, the path metric generators $88_k$, the threshold generators $92_k$, and the register 94, which will further be described later. When the controller 72 terminates the operation thereof, the most likely path $\underline{x}$ is derived from the output terminal 82.

Figure 10:
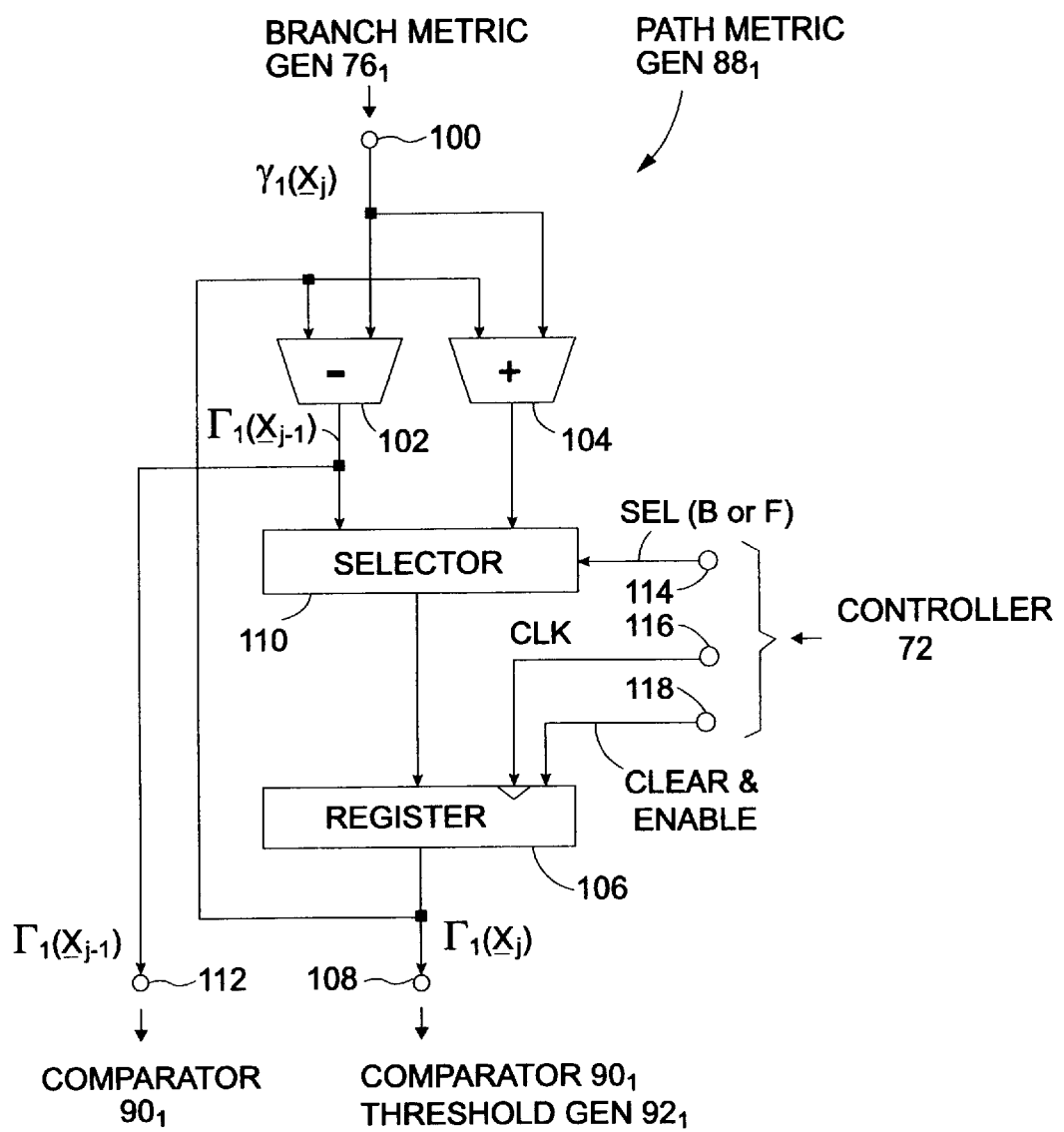
FIG. 10 is a block diagram showing one block of the decoder of FIG. 9 in detail.
Figure 11:
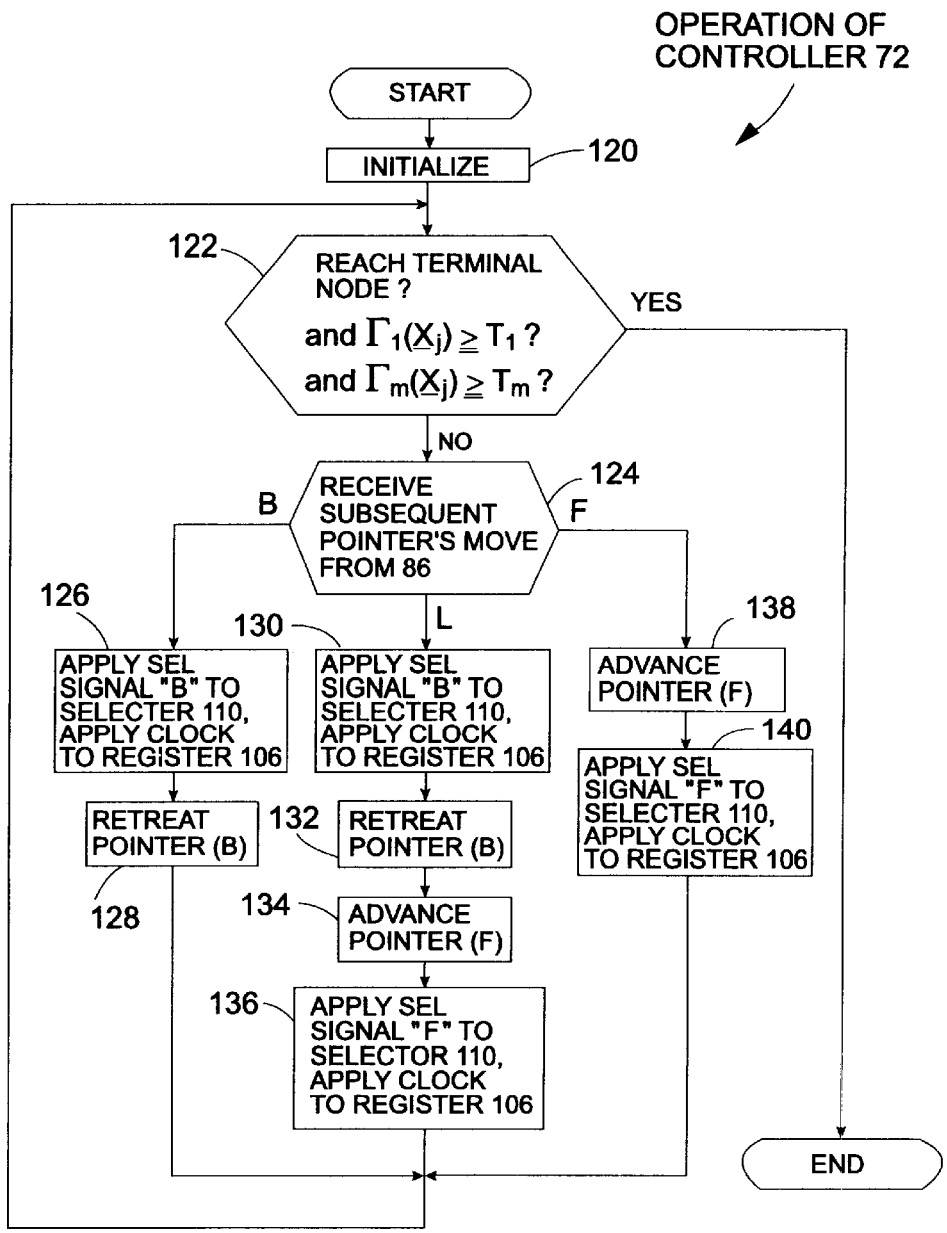
FIG. 11 is a flow chart which shows the steps which characterize the operation of a controller that forms part of the sequential decoder of FIG. 9.

Reference is made to FIGS. 10 and 11. FIG. 10 is a block diagram showing one example of the path metric generator $88_1$, in terms of the configuration thereof. The other path metric generator $88_2$ is configured in exactly the same manner as $88_1$. On the other hand, FIG. 11 is a flow chart showing the steps that depict the operation of the controller 72 focusing primarily on the control of path metric generator $88_1$ of FIG. 10.

Before turning to FIG. 10, steps 120, 122, and 124 of FIG. 11 will first be described. As in the above, $\underline{x}_j$ denotes the path defined by the pointer, and a suffix k is used to denote two metric values for the sake of simplifying the disclosure.

In FIG. 11, the routine starts with step 120. At this step 120, an address, which specifies the origin node of the tree code, is set to the pointer generator 80 (FIG. 9). Further, at step 120, the controller 72 applies a logic level 0 (clear signal) to the path metric generators $88_k$, the threshold generators $92_k$, and the register 94. Still further, at step 120, the controller 72 applies one clock to the above-mentioned blocks $88_k$, $92_k$, and 94 while applying the logic level 0 thereto, thereby initializing them. Still further, at step 120, the controller 72 continues to apply a logic level 1 (enable signal) to the blocks $88_k$, $92_k$, and 94 in order to maintain the enable states thereof. Thereafter, the routine goes to step 122. At step 122, a check is made to determine if the pointer reaches a terminal node and if $\Gamma_1(\underline{x}_j) \geq T_1$ and $\Gamma_2(\underline{x}_j) \geq T_2$. If the inquiry made at step 122 is affirmative, the routine terminates, and otherwise (if negative), the routine proceeds to step 124 at which the routine branches out, depending on the pointer control signal (i.e., indicating "B", "L" or "F") applied from the operation determiner 86, to one of steps 126, 130, or 138.

Returning to FIG. 10, the path metric generator $88_1$ receives the branch metric $\gamma_1(\underline{x}_j)$ and then outputs the two path metrics $\Gamma_1(\underline{x}_{j-1})$ and $\Gamma_1(\underline{x}_j)$. It is to be noted that $\underline{x}_j$ and $\underline{x}_{j-1}$ merely indicate a relative relationship between the input and output of the generator $88_1$. That is to say, since the pointer moves backward and forward in the code tree, the branch metric may change from y $\gamma_1(\underline{x}_j)$ (as indicated in FIG. 10) to $\gamma_1(\underline{x}_{j-1})$ or $\gamma_1(\underline{x}_{j+1})$, in the case of which the path generator $88_1$ issues "$\Gamma_1(\underline{x}_{j-2})$ and $\Gamma_1(\underline{x}_{j-1})$" or "$\Gamma_1(\underline{x}_j)$ and $\Gamma_1(\underline{x}_{j+1})$". It is deemed advantageous to divide the operations of the path metric generator $88_1$ according to the three different moves of the pointer, viz., (a) backward move, (b) forward move, and (c) lateral move.

(a) In the case of moving backward the pointer:

A register 106 has already stored a path metric $\Gamma_1(\underline{x}_j)$ which has been determined during the preceding decoding step. A branch metric $\gamma_1(\underline{x}_j)$, which has also been determined during the preceding decoding step, is being applied to a subtracter 102 and an adder 104 via an input terminal 100. In such a case, the output of the subtracter 102, $\Gamma_1(\underline{x}_{j-1})$ ($=\gamma_1(\underline{x}_j) - \gamma_1(\underline{x}_j)$), is applied to the comparator $90_1$ via an output terminal 112. However, at this stage, the comparator $90_1$ neglects the path metric $\Gamma_1(\underline{x}_{j-1})$ fed thereto. Subsequently, the controller 72 supplies a selector 110 with a selector control signal SEL indicating "backward move of pointer (B)", in response to which the selector 110 selects the output of the subtracter 102 ($\Gamma_1(\underline{x}_{j-1}) = \Gamma_1(\underline{x}_j) - \gamma_1(\underline{x}_j)$), and thereafter, the controller 72 applies a clock to the register 106, in response to which the register 106 acquires the output of the subtracter 102 ($\Gamma_1(\underline{x}_{j-1})$)(step 126 of FIG. 11). Therefore, the content of register 106 is renewed from $\Gamma_1(\underline{x}_j)$ to $\Gamma_1(\underline{x}_{j-1})$, and the renewed path metric $\Gamma_1(\underline{x}_{j-1})$ is applied to the comparator $90_1$ and the threshold generator $92_1$. Following this, the controller 72 moves backward the pointer (step 128 of FIG. 11), whereby a branch metric $\gamma_1(\underline{x}_{j-1})$ is determined at the branch metric generator $76_1$, and applied to the path metric generator $88_1$ via the input terminal 100. As a result, the subtracter 102 changes the output thereof from $\Gamma_1(\underline{x}_{j-1})$ to $\Gamma_1(\underline{x}_{j-2})$ which is applied to the comparator $90_1$ and acknowledged thereby.

(b) In the case of moving forward the pointer:

As in the above case (a), the register 106 has already stored the path metric $\Gamma_1(\underline{x}_j)$ which has been determined during the preceding decoding step. Further, the branch metric $\gamma_1(\underline{x}_j)$, which has also been determined during the preceding decoding step, is being applied to the subtracter 102 and the adder 104 via the input terminal 100. Thereafter, the controller 72 moves forward the pointer (step 138 of FIG. 11), whereby a branch metric $\gamma_1(\underline{x}_{j+1})$ is determined at the branch metric generator $76_1$ and applied to the path metric generator $88_1$ via the input terminal 100. Subsequently, the controller 72 supplies the selector 110 with the selector control signal SEL indicating "forward move of pointer (F)", in response to which the selector 110 selects the output of the adder 104 ($\Gamma_1(\underline{x}_{j+1})=\Gamma_1(\underline{x}_j)+\gamma_1(\underline{x}_{j+1})$), and thereafter, the controller 72 applies a clock to the register 106, in response to which the register 106 acquires the output of the adder 104 ($\Gamma_1(\underline{x}_{j+1})$)(step 140 of FIG. 11). Therefore, the content of register 106 is renewed from $\Gamma_1(\underline{x}_j)$ to $\Gamma_1(\underline{x}_{j+})$, and the renewed path metric $\Gamma_1(\underline{x}_{j+1})$ is applied to the comparator $90_1$ and the threshold generator $92_1$. Further, the output of the subtracter 102 becomes $\Gamma_1(\underline{x}_j)$ ($=\Gamma_1(\underline{x}_{j+1}) \gamma_1(\underline{x}_{j+1})$), which is applied to the comparator $90_1$ via the output terminal 112.

(c) In the case of laterally moving the pointer:

This case is substantially the combination of the above-mentioned two cases (a) and (b). As in the above case (a) or (b), the register 106 has already stored the path metric $\Gamma_1(\underline{x}_j)$ which has been determined during the preceding decoding step. Further, the branch metric $\gamma_1(\underline{x}_j)$, which has also been determined during the preceding decoding step, is being applied to the subtracter 102 and the adder 104 via the input terminal 100. Subsequently, the controller 72 supplies a selector 110 with the selector control signal SEL indicating "backward move of pointer (B)", in response to which the selector 110 selects the output of the subtracter 102 ($\Gamma_1(\underline{x}_{j-1})=\Gamma_1(\underline{x}_j)-\gamma_1(\underline{x}_j)$), and thereafter, the controller 72 applies a clock to the register 106, in response to which the register 106 acquires the output of the subtracter 102 ($\Gamma_1(\underline{x}_{j-1})$)(step 130 of FIG. 11). Following this, the controller 72 moves backward the pointer (step 132 of FIG. 11), after which the controller 72 moves forward the pointer (step 134 of FIG. 11). Therefore, the branch metric $\gamma_1(\underline{x}_j)$ is determined at the branch metric generator $76_1$ and applied to the path metric generator $88_1$ via the input terminal 100. It should be noted that the just-mentioned branch metric $\gamma_1(\underline{x}_j)$ differs from the initially mentioned branch metric $\gamma_1(\underline{x}_j)$ because the former branch is different from the latter branch although both stem from the same node. Subsequently, the controller 72 supplies the selector 110 with the selector control signal SEL indicating "forward move of pointer (F)", in response to which the selector 110 selects the output of the adder 104 ($\Gamma_1(\underline{x}_j)=\gamma_1(\underline{x}_{j-1})+\Gamma_1(\underline{x}_j)$), and thereafter, the controller 72 applies a clock to the register 106, in response to which the register 106 acquires the output of the adder 104 ($\Gamma_1(\underline{x}_j)$)(step 136 of FIG. 11). Therefore, the content of register 106 is renewed from $\Gamma_1(\underline{x}_j)$ to $\Gamma_1(\underline{x}_j)$ (since the branch is different, these two path metrics $\Gamma_1(\underline{x}_j)$ are different), and the renewed path metric $\Gamma_1(\underline{x}_j)$ is applied to the comparator $90_1$ and the threshold generator $92_1$. Further, the output of the subtracter 102 becomes $\Gamma_1(\underline{x}_{j-1})$ ($=\Gamma_1(\underline{x}_j)-\gamma_1(\underline{x}_j)$), which is applied to the comparator $90_1$ via the output terminal 112.

Figure 12:
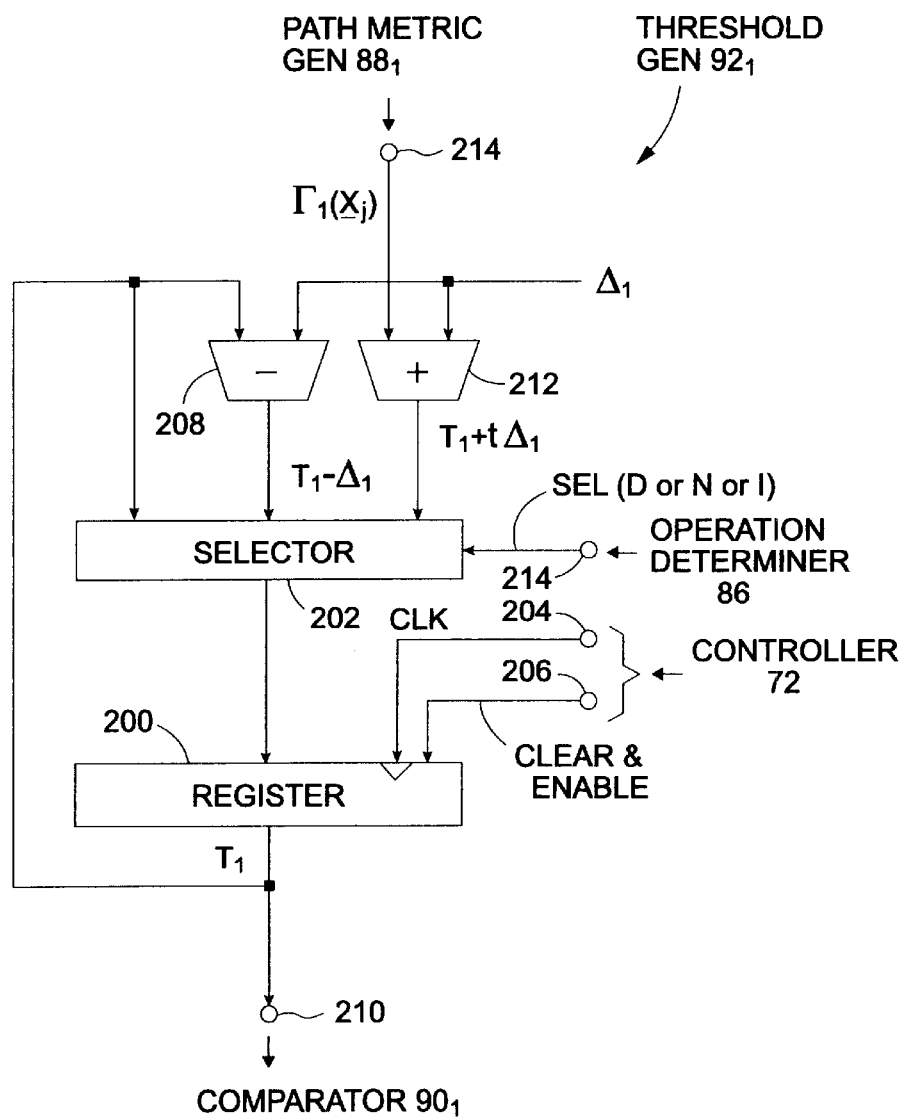
FIG. 12 is a block diagram showing another block in detail which forms part of the sequential decoder of FIG. 9.

FIG. 12 is a diagram which shows the threshold generator $92_1$ in detail in block diagram form. The other threshold generator $92_2$ is configured in exactly the same manner as the generator $92_1$. A register 200, which is provided to temporarily store a threshold $T_1$, is initialized to zero (viz., $T_1$=0) in response a clock pulse CLK applied thereto from the controller 72 via an input terminal 204 while receiving a logic level 0 (clear signal) from the controller 72 via an input terminal 206. On the other hand, the register 200 retains the value fed thereto from a selector 202 in response to the clock pulse CLK while receiving a logic level 1 (enable signal) via the input terminal 206.

Assuming that the register 200 has held therein the threshold $T_1$ applied thereto from the selector 202. The threshold $T_1$ thus stored in the register 200 is applied to the selector 202, a subtracter 208, and an output terminal 210 coupled to the comparator $90_1$. The subtracter 208 subtracts the predetermined threshold spacing $\Delta_1$ from the threshold $T_1$, and applies the computation result ($T_1-\Delta_1$) to the selector 202. An adder 212 is supplied with the path metric $\Gamma_1(\underline{x}_j)$ from the path metric $88_1$ via an input terminal 214 and the threshold spacing $\Delta_1$, and determines an integer $t_1$ that exhibits the maximum value satisfying $$\Gamma_1(\underline{x}_j)-\Delta_1 < T_1+t_1 \leq \Gamma_1(\underline{x}_j)$$

and then applies $T_1+t_1\Delta_1$ to the selector 202. This selector 202 operates such as to select one of the three inputs in response to a selector control signal SEL, which is applied from the operation determiner 86 via an input terminal 214 and which instructs "increment (I)", "decrement (D)" or "no-change (N)" of the threshold $T_1$. The threshold $T_1$ thus selected by the selected 202 is stored in the register 200, and also applied to the comparator $90_1$.

Figure 13:
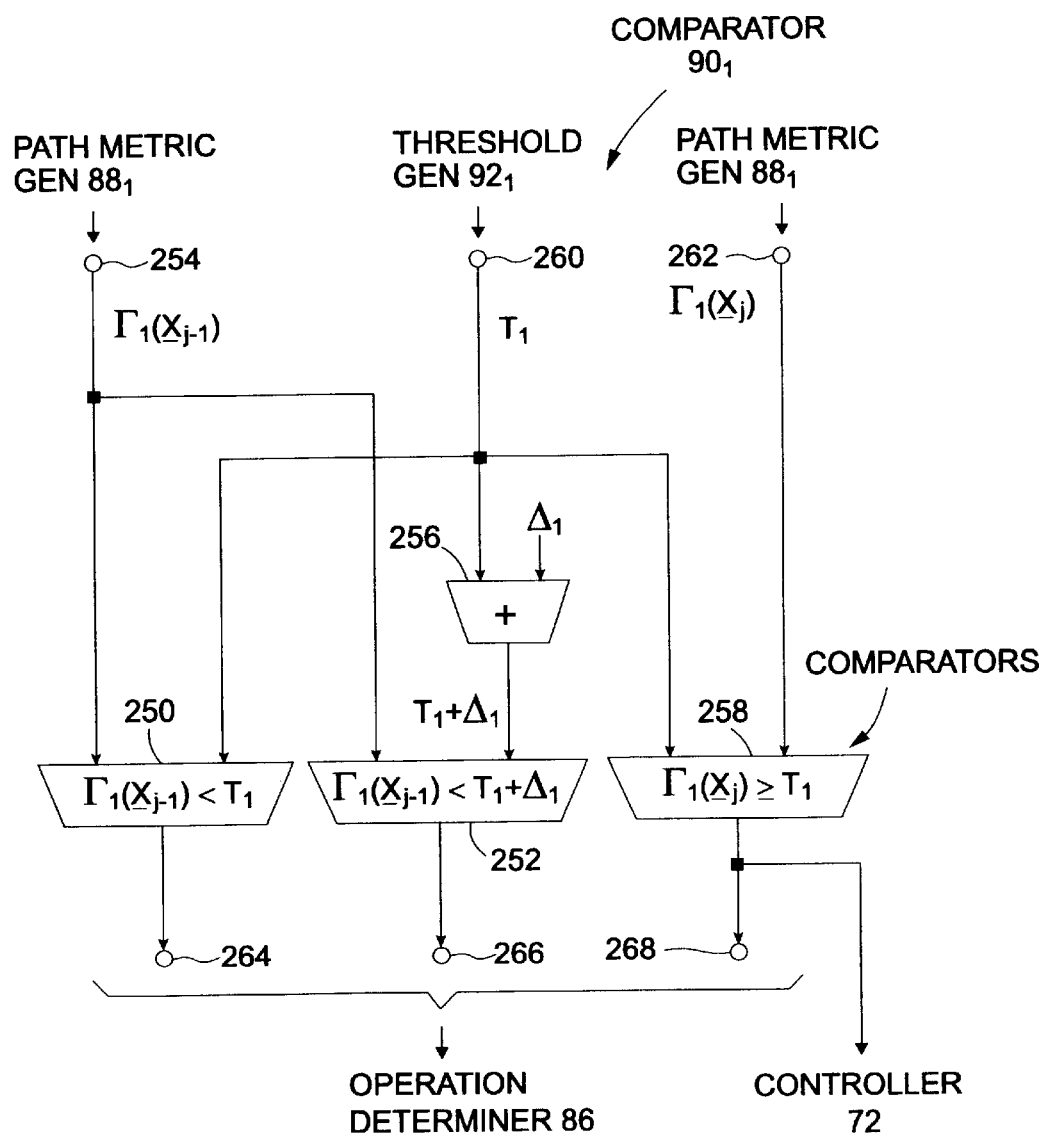
FIG. 13 is a diagram showing operations of another block in detail that forms part of the sequential decoder of FIG. 9.

Referring to FIG. 13, the comparator $90_1$ of FIG. 9 is broke down in terms of the configuration thereof and shown in block diagram form. The other comparator $90_2$ is configured exactly in the same manner as the comparator $90_1$. In FIG. 13, the path metric $\Gamma_1(\underline{x}_{j-1})$ is applied from the path metric generator $88_1$ to two comparators 250 and 252 via an input terminal 254. Further, the threshold $T_1$ is applied to the comparator 250, an adder 256, and a comparator 258 by way of an input terminal 260. Still further, the path metric $\Gamma_1(\underline{x}_j)$ is applied to the comparator 258 from the path metric generator $88_1$ via an input terminal 262. The adder 256 adds the threshold $T_k$ and the threshold spacing $\Delta_1$, and applies the sum ($T_1+\Delta_1$) to the comparator 252. The comparator 250 compares $\Gamma_1(\underline{x}_{j-1})$ and $T_1$, and applies the comparison result of whether $\Gamma_1(\underline{x}_{j-1})<T_1$ to the operation determiner 86 by way of an output terminal 264. Further, the comparator 252 compares $\Gamma_1(\underline{x}_{j-1})$ and ($T_1+\Delta_1$), and applies the comparison result indicating if $\Gamma_1(\underline{x}_{j-1})<(T_1+\Delta_1)$ to the operation determiner 86 by way of an output terminal 266. Still further, the comparator 258 compares $\Gamma_1(\underline{x}_j)$ and $T_1$, and applies the comparison result indicative of whether or not $\Gamma_1(\underline{x}_j) \geq T_1$ to the operation determiner 86 by way of an output terminal 268 and also to the controller 72.

Figure 14:
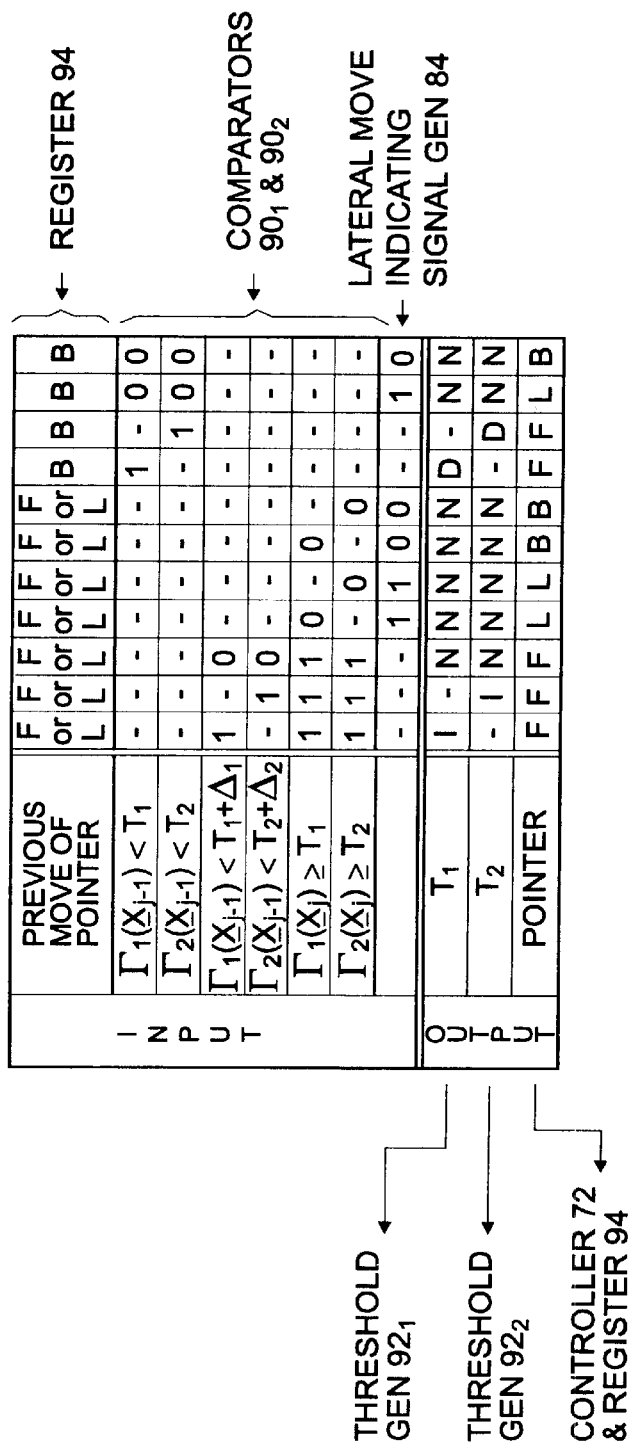
FIG. 14 is a functional table showing the operation of another block which forms part of the sequential decoder of FIG. 9 in detail.

Reference is made to FIG. 14, there is shown an function table in connection of the operation determiner 86. As shown, the operation determiner 86 receives three kinds of signals and data as follows. The first is the data indicative of the previous move of the pointer applied from the register 94, the second is the comparison results applied from the comparators $90_k$(k=1, 2), and the third is the lateral move indicating signal supplied from the generator 84. Further, the operation determiner 86 issues three kinds of outputs. The first and second are respectively the threshold control signals via which the thresholds $T_1$ and $T_2$ are controlled, and the third is a pointer move control signal which indicates one of the three kinds of pointer's moves.

As mentioned above, "F", "L" and "B" in the table are respectively indicative of the pointer's moves of "forward (F)", "lateral (L)" and "backward (B)", and "I", "D"and "N" respectively indicate "Increment (I)", "Decrement (D)" and "No-change (N)"of the threshold. The comparison results, received from the comparator $90_k$ (k=1, 2), are:

"$\Gamma_k(\underline{x}_{j-1}) < T_k$", "$\Gamma_k(\underline{x}_{j-1}) < (T_k + \Delta_k)$" and "$\Gamma_k(\underline{x}_j) \geq T_k$"

The logic level 0, applied from the comparators $90_k$, indicates that the corresponding inequality has not been established while the logic level 1 indicates that the corresponding inequality has been established. The logic levels "1" and "0" applied from the lateral move indicating signal generator 84 respectively represent that the lateral move of the pointer is possible and impossible.

The notation "-", illustrated in the input side in the table, implies that the comparison result applied thereto is a don't-care one (viz., may take either 1 or 0). Further, the notation "-" shown at the output side represents that the threshold control depends on the condition of other row.

A second embodiment of the present invention will be described with reference to FIGS. 15–19.

In the following, a combination of the above-mentioned p($\underline{y}$), p($\underline{y}$)/p($\underline{y}|\underline{x}_j$), and p($\underline{x}_j$) is called a probability model. In an application using sequential decoding, different kind of probability models can be determined depending on which information is defined as one symbol of a data sequence. Accordingly, there can exist a plurality of probability models with one application. For example, in the technical field of speech recognition, it is possible to define a digital signal, which corresponds to each of the sampled values generated by converting an analog speech signal into the corresponding digital signal, as one symbol. In the first embodiment, a single probability model is treated and thus only two path metrics are used. However, the present invention is in no way limited to the case where only the two path metrics are used. That is, the present invention is applicable to more than two (denoted by "m") pairs of path metric and threshold.

The number of "m" is determined as follows. Assuming that k denotes the total number of probability models to be used in a given application, and further assuming that the two path metrics are used with g ($1 \leq g \leq k$) probability models, and the Fano metric is used with the remaining probability models whose number is k−g, then "m" becomes k+g. The present invention is to effectively reduce the number of paths to be examined depending on the probability of occurrence of the paths in the code tree. Therefore, it follows that if the number of paths to be examined can be reduced if the two path metrics are used with g probability models, then it is sufficient to use the Fano metric in connection with the remaining k−g probability models.

FIG. 15 is a diagram showing the rules for implementing the sequential decoding according to the second embodiment, which rules are listed or arranged in a manner similar to those shown in FIG. 6. The foot notes shown in FIG. 6 are applicable to the rules of FIG. 15, and thus they are omitted in FIG. 15 for the sake of simplifying the disclosure. As shown in FIG. 15, each of the numbers of rules 1 and 4 increases so as to meet the number of pairs of metric and threshold (viz., "m"). Other than this, the rules of FIG. 15 are identical to those of FIG. 6. The rules of FIG. 15 are readily understood from the foregoing, and accordingly further descriptions thereof will be omitted for brevity.

According to the second embodiment, if a given node is revisited to be examined, the decoder advances the pointer to that node with a combination of thresholds ($T_1, T_2, \ldots, T_m$) which is different on the previous visit. Therefore, the sequential decoding according to the second embodiment is not trapped in a loop as in the first embodiment.

Figure 16:
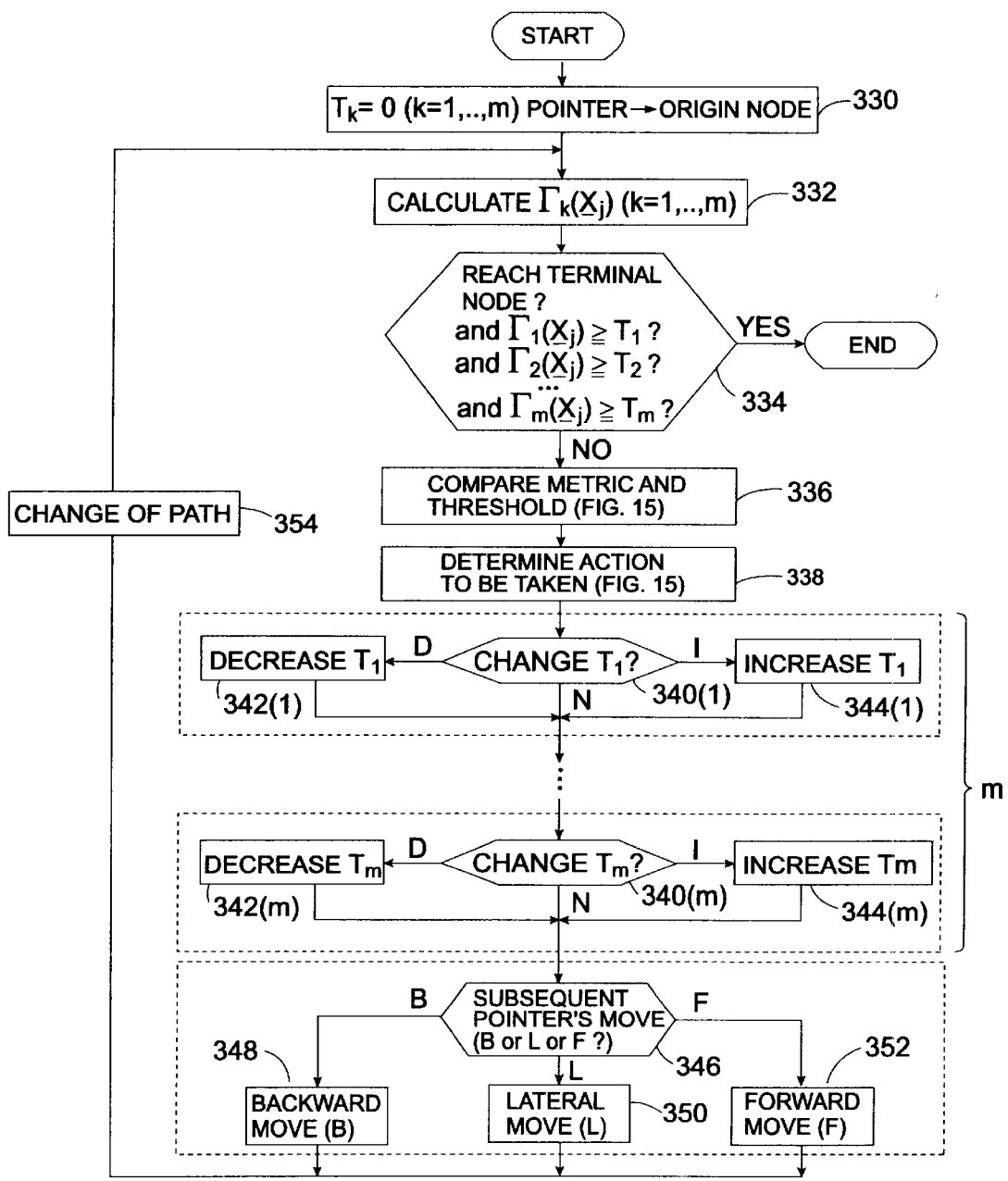
FIG. 16 is a flow chart which shows the steps which characterize the sequential decoding according to the second embodiment of the present invention.

FIG. 16 is a flow chart which shows the steps which characterize the sequential decoding according to the second embodiment. The procedure indicated in FIG. 16 is substantially identical to that in FIG. 8 expect that the former procedure is to handle more than two pairs of metric $\Gamma_1$-$\Gamma_m$ and threshold $T_1$-$T_m$. Steps 330–352 of FIG. 16 are respectively similar or identical to steps 30–52 in FIG. 8. The second embodiment is an extension of the first embodiment, and thus, it will readily be understandable from the descriptions already made in connection with the first embodiment, and as such, further descriptions thereof will not be given for the sake of simplifying the disclosure.

Figure 17:
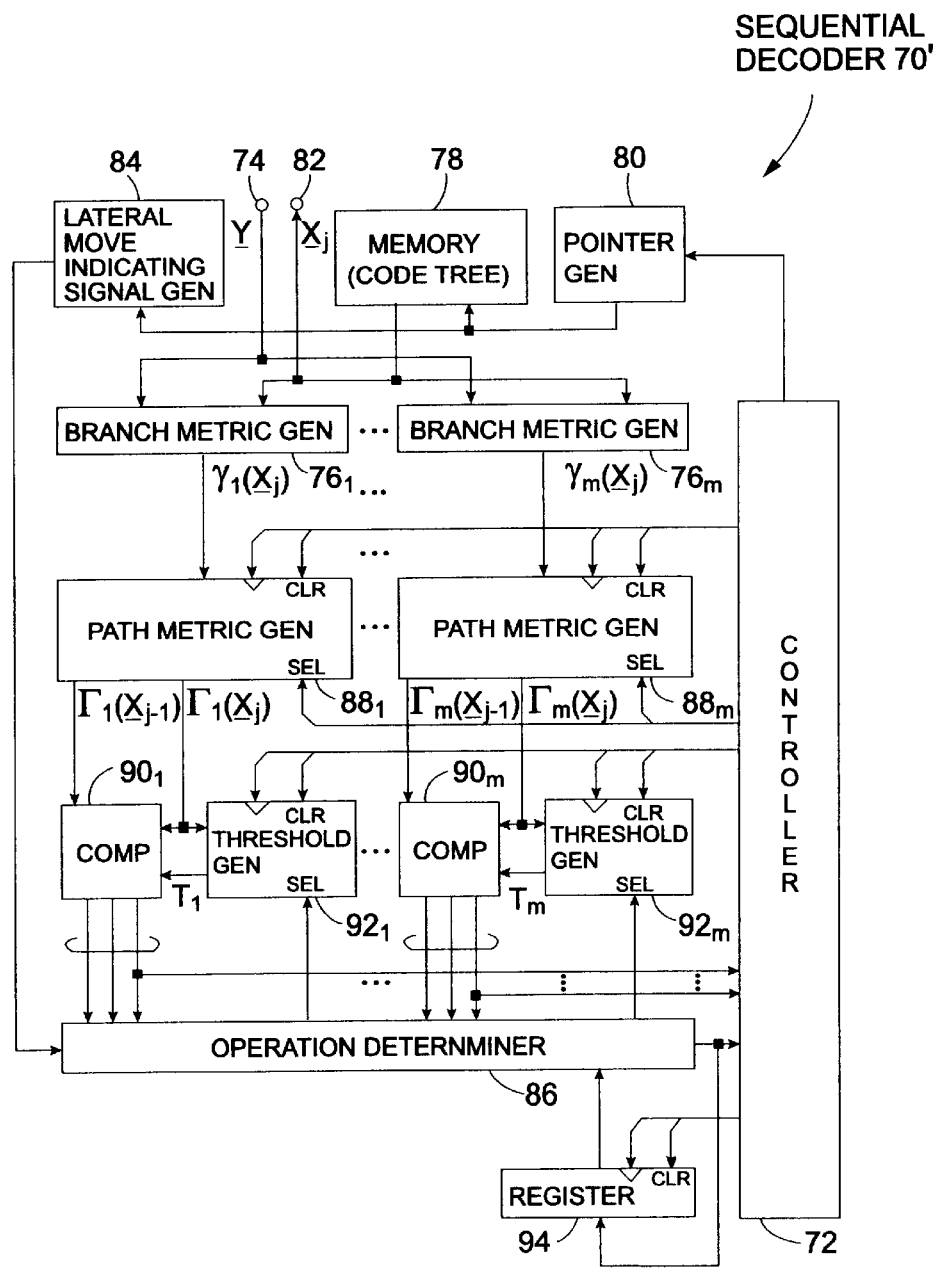
FIG. 17 is a block diagram schematically showing one example of the sequential decoder according to the second embodiment of the present invention.

FIG. 17 is a block diagram schematically showing one example of a sequential decoder (denoted by 70') in accordance with the second embodiment. In the second embodiment, since the number of the path metrics and thresholds to be processed is more than two (viz. m>2), each of the numbers of branch and path metric generators, comparators, and the threshold generators is increased by m, accordingly. Other than this, the arrangement of FIG. 17 is substantially identical to that of FIG. 9, and hence, the reference numerals identical to those in FIG. 9 are used such that the branch metric generators, for example, are labeled $76_1$–$76_m$. The operation of the sequential decoder 70'will be readily understandable from the foregoing descriptions already made in regard of the sequential decoder 70 of FIG. 9, and as such, the further descriptions thereof is deemed redundant and thus will be omitted for the sake of simplicity.

Figure 18:
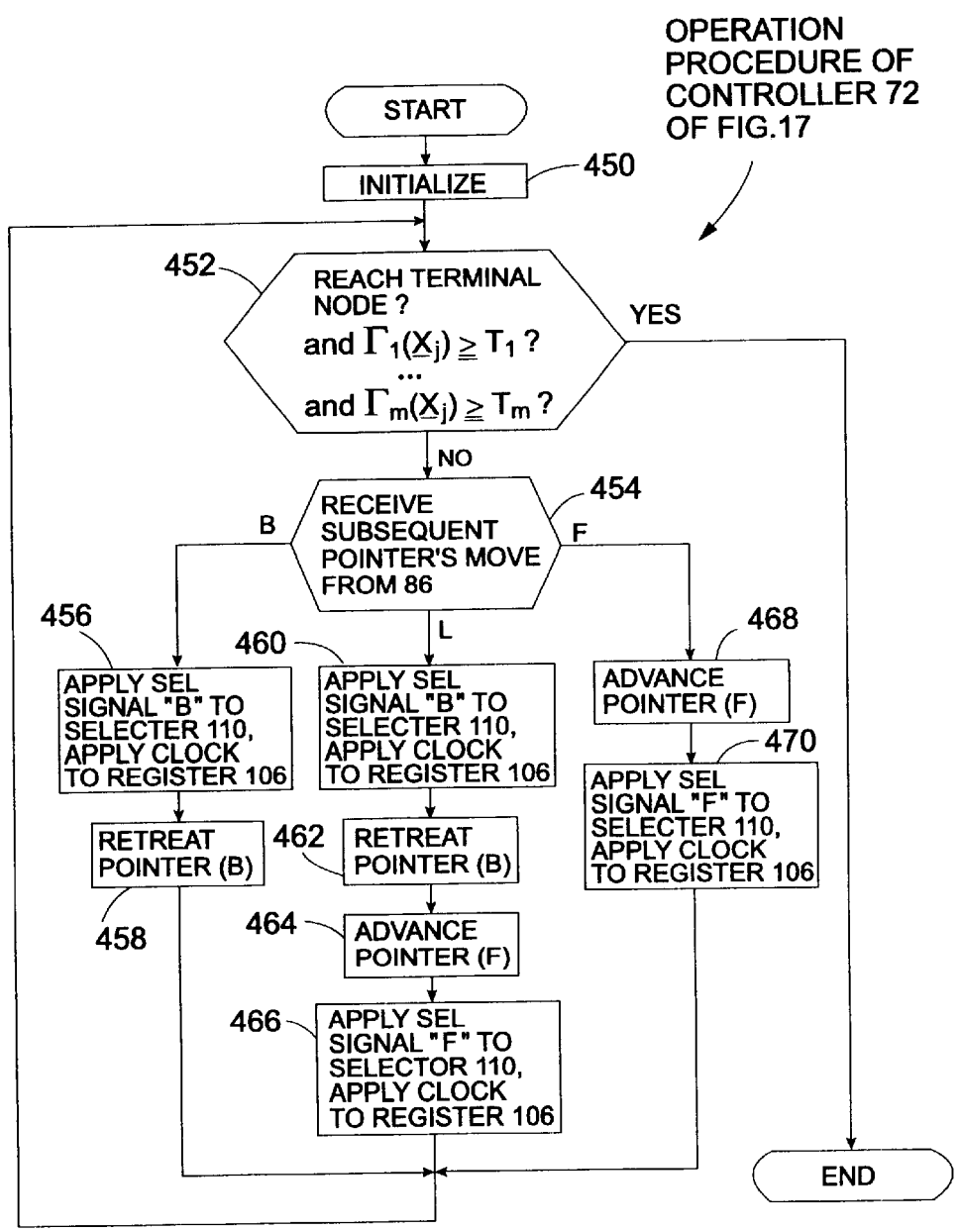
FIG. 18 is a flow chart which shows the steps which characterize the operation of a controller that forms part of the sequential decoder of FIG. 17.

FIG. 18 is a flow chart which shows the steps which characterize the operation procedure of the controller 72 of FIG. 17. The operation procedure shown in FIG. 18 is substantially identical to that shown in FIG. 11 except that the former procedure treats more than three path metrics and thresholds. Since the detailed description of FIG. 18 is deemed redundant, and accordingly, further descriptions will not be given for simplifying the disclosure.

Figure 19:
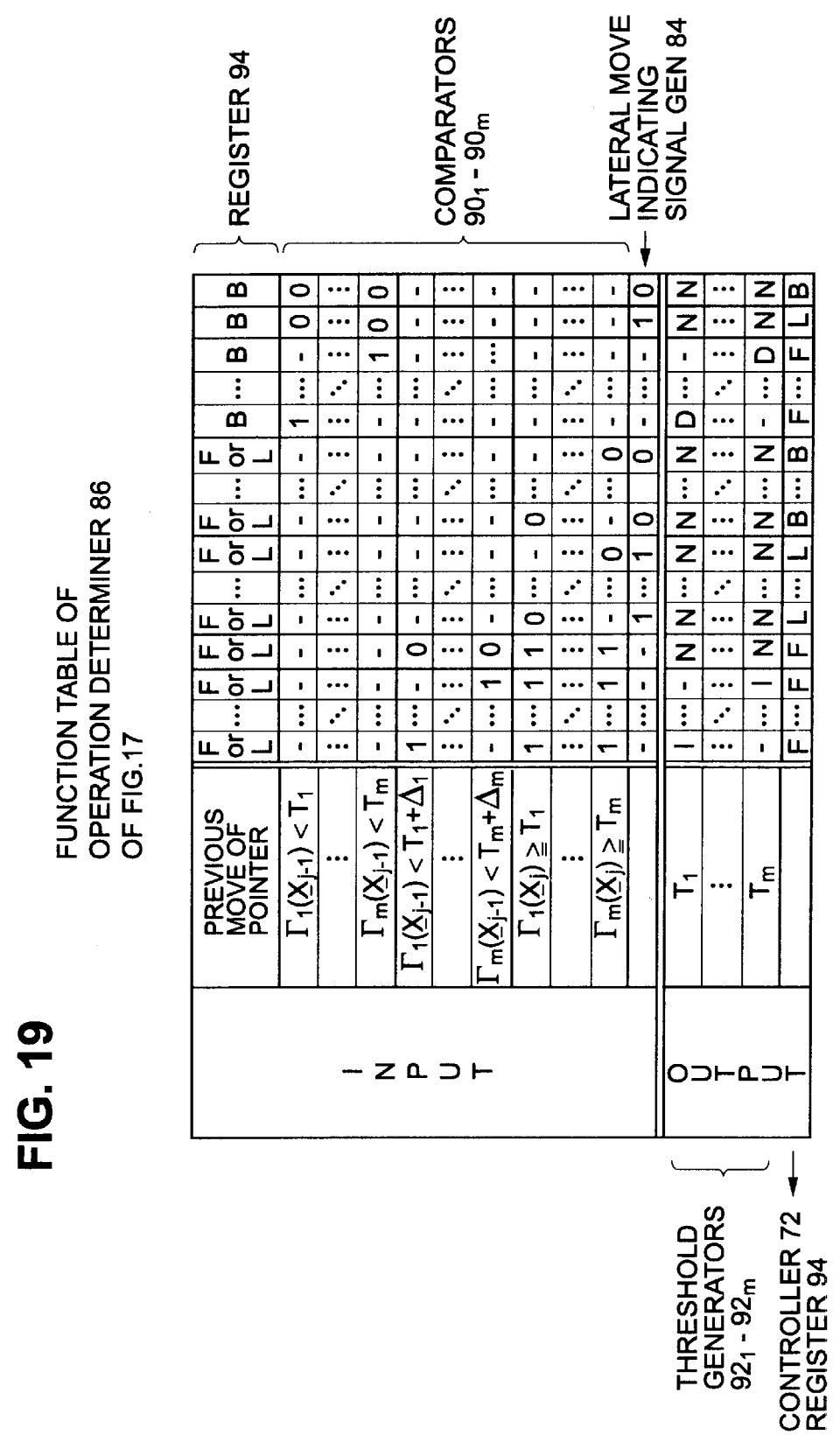

FIG. 19 is a diagram showing a function table that indicates the operations of the operation determiner 86 of FIG. 17, and corresponds to FIG. 14. The function of the operation determiner 86 of FIG. 17 will be clearly understood when referring to the descriptions of FIG. 14, and thus the detailed descriptions of FIG. 19 will be omitted.

Although the two embodiments have been discussed, it goes without saying that the present invention is not restricted thereto. For example, the embodiments have been described on the basis of the Fano algorithm recited in the above-mentioned book by Robert G. Gallager. However, the present invention can be made using any prior sequential decoding or any version of the Fano algorithm.

Still further, in the above descriptions, $\Gamma_k(\underline{x}_{-1})$ is defined as $-\sigma$ whereby it renders it unnecessary to advise the operation determiner 86 that the pointer has been returned to the origin node. It is however within the scope of the present invention to inform, without defining $\Gamma_k(\underline{x}_{-1})=-\sigma$, the operation determiner 86 that the pointer has returned to the origin node, and determine the operation of the operation determiner 86 based on such information. Still further, it is possible to modify some of the operation rules shown in FIGS. 6 and 15. For example, the condition of $\Gamma_k(\underline{x}_1) \geq T_k$ can be replaced by $\Gamma_k(\underline{x}_j) \geq T_k + \Delta_k$. This is because the increasing of the threshold T in the Fano algorithm is to implement the operation shown in Note 1 of FIG. 5, and accordingly, the increasing of the threshold T is carried out in the case of $\Gamma_k(\underline{x}_{j-1}) < T + \Delta$ and at the same time $\Gamma_k(\underline{x}_j) \geq T + \Delta$.

Still further, in the above-mentioned embodiments, the next action to be taken is determined based on the metric $\Gamma_k$ and the threshold $T_k$. However, it is readily understood that the next action to be taken is capable of being decided only on the basis of the value of $\Gamma_k - T_k$. If so modified, it is possible to reduce the number of registers, and further possible to prevent an overflow of each of the registers provided for storing $\Gamma_k$ and $T_k$.

Still further, in the above-mentioned embodiments, the most likely path x is directly outputted from the output terminal 82 (FIGS. 9 and 17). As an alternative, it is possible to generate, as an output of the decoder, a predetermined code which corresponds to the most likely path x. In this case, it is necessary to previously prepare a plurality of codes which respectively correspond to a plurality of paths in the code tree.

The foregoing descriptions show only two preferred embodiments and some modifications thereof. However, other various modifications are apparent to those skilled in the art without departing from the scope of the present invention which is only limited by the appended claims. Therefore, the embodiments and modification shown and described are only illustrated, not restrictive.

What is claimed is:

1. An apparatus for sequentially decoding a plurality of symbol sets of an incoming data sequence, comprising:

a memory for storing a code tree which comprises a plurality of paths defined by a plurality of sequences of nodes;

a pointer generator for generating a pointer which defines a node which specifies a path in said code tree;

a plurality of branch metric generators, each of which generates a metric of a branch which forms part of a path and which is to be examined with a corresponding symbol set of said incoming data sequence;

a plurality of path metric generators, which respectively receive the branch metrics from said plurality of branch metric generators and respectively generate path metrics using said branch metrics; and a controller for controlling said pointer generator and said plurality of path metric generators such as to maximize each of said plurality of path metrics at each of decoding steps for sequentially decoding the symbol sets of said incoming data sequence.

2. The apparatus as claimed in claim 1, wherein one of said plurality of path metric generators generates a path metric which is decided by a logarithm of a probability of occurrence of said paths.

3. The apparatus as claimed in claim 1, wherein said controller controls said pointer generator in accordance with a Fano algorithm.

4. The apparatus of claim 1, wherein the plurality of path metric generators comprise a Fano metric generator.

5. The apparatus of claim 1, wherein the plurality of path metric generators comprise a path metric generator that generates a second metric which is not a Fano metric.

6. The apparatus of claim 5, wherein the second metric is based on a logarithm of a probability of occurrence of a path in the code tree.

7. A method of sequentially decoding a plurality of symbol sets of an incoming data sequence by way of data search through a code tree stored in a memory, said code tree comprising a plurality of paths defined by a plurality of sequences of nodes, said method comprising the steps of:

(a) generating a pointer which defines a node which specifies a path in said code tree;

(b) generating a plurality of branch metrics each of which relates to a branch which forms part of a path and which is to be examined with a corresponding symbol set of said incoming data sequence;

(c) determining a plurality of path metrics using said plurality of branch metrics; and (d) controlling the generation of said pointer and the determination of said plurality of path metrics such as to maximize each of said plurality of path metrics at each of decoding steps for sequentially decoding the symbol sets of said incoming data sequence.

8. The method as claimed in claim 7, wherein one of said plurality of path metrics is generated using a logarithm of a probability of occurrence of said paths.

9. The method as claimed in claim 7, wherein step (d) is implemented in accordance with a Fano algorithm.

10. The method of claim 7, wherein the plurality of path metrics comprise a Fano metric.

11. The method of claim 7, wherein the plurality of path metrics comprise a second metric which is not a Fano metric.

12. The method of claim 11, wherein the second metric is based on a logarithm of a probability of occurrence of a path in the code tree.

* * * * *